United States Patent
Tanikawa et al.

(10) Patent No.: US 8,084,530 B2
(45) Date of Patent: Dec. 27, 2011

(54) SEALING AGENT FOR OPTICAL SEMICONDUCTOR ELEMENT, AND OPTICAL SEMICONDUCTOR ELEMENT

(75) Inventors: Mitsuru Tanikawa, Osaka (JP); Takashi Watanabe, Osaka (JP); Takashi Nishimura, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 122 days.

(21) Appl. No.: 12/452,058

(22) PCT Filed: Jun. 13, 2008

(86) PCT No.: PCT/JP2008/060839
§ 371 (c)(1),
(2), (4) Date: Feb. 26, 2010

(87) PCT Pub. No.: WO2008/153125
PCT Pub. Date: Dec. 18, 2008

(65) Prior Publication Data
US 2010/0171414 A1    Jul. 8, 2010

(30) Foreign Application Priority Data

Jun. 15, 2007 (JP) ................................. 2007-158591
Jul. 17, 2007 (JP) ................................. 2007-186080
Oct. 2, 2007 (JP) ................................. 2007-259074

(51) Int. Cl.
*C08K 3/34* (2006.01)
*H01J 1/62* (2006.01)
(52) U.S. Cl. .................. 524/442; 525/478; 313/502

(58) Field of Classification Search ................... None
See application file for complete search history.

(56) References Cited

U.S. PATENT DOCUMENTS

| | | | | |
|---|---|---|---|---|
| 4,965,657 A * | 10/1990 | Ogata et al. | ................... | 257/786 |
| 5,151,520 A * | 9/1992 | Gottschalk et al. | ........... | 126/638 |
| 5,206,328 A * | 4/1993 | Okamura et al. | ............... | 528/14 |
| 5,486,588 A * | 1/1996 | Morita | ............................ | 528/15 |

(Continued)

FOREIGN PATENT DOCUMENTS

JP            6-240001            8/1994

(Continued)

OTHER PUBLICATIONS

International Search Report issued Aug. 19, 2008 in International (PCT) Application No. PCT/JP2008/060839.

*Primary Examiner* — Robert Loewe
(74) *Attorney, Agent, or Firm* — Wenderoth, Lind & Ponack, L.L.P.

(57) ABSTRACT

The sealing agent for an optical semiconductor device, which comprises: a silicone resin having a cyclic ether-containing group in the molecular structure; a heat curing agent capable of reacting with the cyclic ether-containing group; and a fine particulate material of silicon oxide, and the sealing agent having a viscosity of 500 to 10,000 mPa·s measured by an E-type viscometer at 25° C. at 5 rpm, a thixotropic value of 1.2 to 2.5 calculated by dividing a viscosity measured by the E-type viscometer at 25° C. at 1 rpm by a viscosity measured at 10 rpm (viscosity at 1 rpm/viscosity at 10 rpm), and a minimum viscosity of 100 mPa·s or higher measured at $1\ s^{-1}$ in the temperature range of 25° C. to a curing temperature by a parallel plate rheometer.

10 Claims, 1 Drawing Sheet

U.S. PATENT DOCUMENTS

| | | | |
|---|---|---|---|
| 5,641,996 A * | 6/1997 | Omoya et al. | 257/787 |
| 5,739,217 A * | 4/1998 | Hagiwara et al. | 525/476 |
| 5,891,969 A * | 4/1999 | Mine et al. | 525/476 |
| 2005/0123776 A1 | 6/2005 | Yoshikawa | |
| 2006/0135723 A1* | 6/2006 | Nakayama | 528/10 |
| 2007/0225465 A1 | 9/2007 | Akiike et al. | |
| 2008/0207848 A1* | 8/2008 | Morita et al. | 525/475 |
| 2009/0091045 A1 | 4/2009 | Tanikawa et al. | |
| 2009/0118440 A1* | 5/2009 | Nakanishi et al. | 525/478 |

FOREIGN PATENT DOCUMENTS

| | | |
|---|---|---|
| JP | 2002-314142 | 10/2002 |
| JP | 2003-73452 | 3/2003 |
| JP | 2003-277473 | 10/2003 |
| JP | 2004-127988 | 4/2004 |
| JP | 2005-171021 | 6/2005 |
| JP | 2006-282988 | 10/2006 |
| JP | 2007-106798 | 4/2007 |
| JP | 2007-131782 | 5/2007 |
| JP | 2008-053529 | 3/2008 |
| JP | 2008-063565 | 3/2008 |
| JP | 2008-106108 | 5/2008 |
| JP | 2008-189917 | 8/2008 |
| JP | 2008-202036 | 9/2008 |
| WO | 2005/100445 | 10/2005 |
| WO | 2007/125956 | 11/2007 |

* cited by examiner

[Fig. 1]
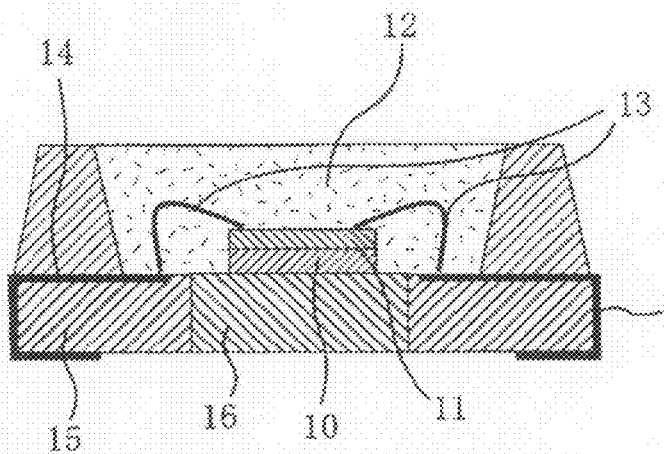
[Fig. 2]
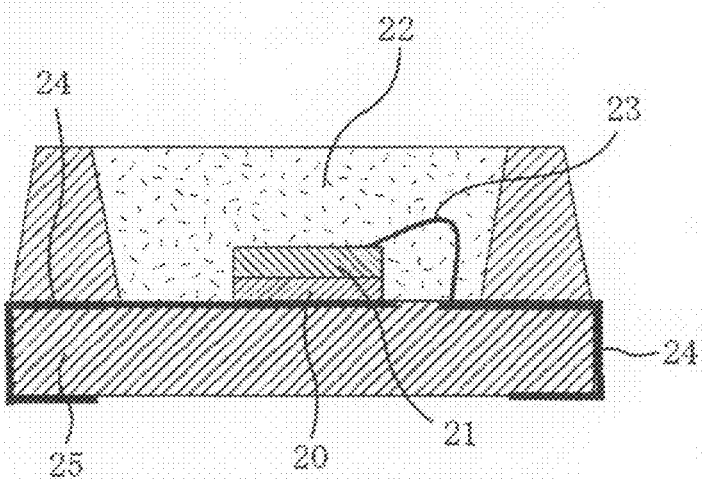
[Fig. 3]
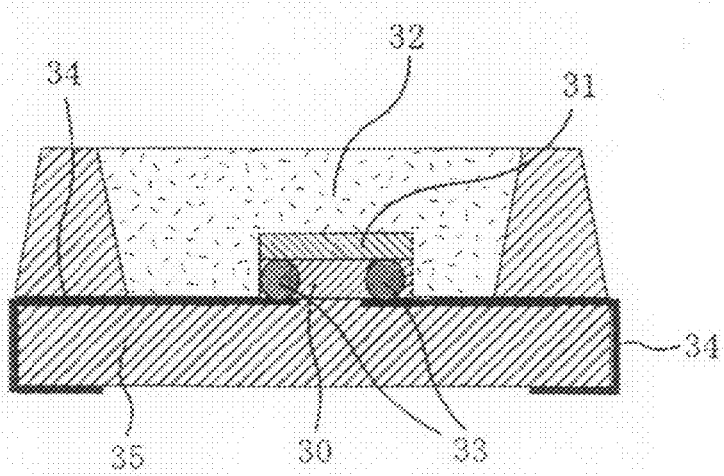

SEALING AGENT FOR OPTICAL SEMICONDUCTOR ELEMENT, AND OPTICAL SEMICONDUCTOR ELEMENT

This application is a U.S. national stage of International Application No. PCT/JP2008/060839 filed Jun. 13, 2008.

TECHNICAL FIELD

The present invention relates to a highly transparent, heat-resistant and light-resistant sealing agent for an optical semiconductor device which provides excellent adhesion, and is capable of stably maintaining its shape and preventing sedimentation of a phosphor when used to seal a light emitting device of an optical semiconductor device. The present invention also relates to an optical semiconductor device formed by using the sealing agent for an optical semiconductor device.

BACKGROUND ART

Light emitting devices of optical semiconductor devices such as light emitting diodes (LEDs) are usually sealed with a sealing agent to avoid direct exposure to the air because their light emitting properties rapidly deteriorate due to water, floating dust and the like in the air. Epoxy resins such as bisphenol type epoxy resins and alicyclic epoxy resins have been used as a resin component in sealing agents for sealing these light emitting devices (see, for example, Patent Document 1) as these resins provide strong adhesion and have excellent dynamic durability.

However, these conventional sealing agents containing an epoxy resin have insufficient heat resistance and light resistance to seal high brightness optical semiconductor devices that have been intensively studied in recent years, and thereby cured products thereof may be problematically colored.

There are some studies to overcome this problem including a study on addition of a compound to improve the heat resistance of an epoxy resin (see, for example, Patent Document 2). However, neither of them achieves sufficient heat resistance.

In addition, a method is known in which a highly heat-resistant and light-resistant silicone resin with high transmittance of light of a short wavelength in the blue to ultraviolet region is used in a sealing agent for sealing an LED light emitting device instead of the epoxy resins.

However, since foreign matters tend to adhere to the light emitting surface owing to surface tackiness of the silicone resin sealing agent, use of the silicone resin sealing agent problematically tends to cause damage to the light emitting surface of the light emitting device. Such damage to the light emitting surface may lead to cracks developing therefrom or a remarkable decrease in the brightness of the light emitting device.

In order to overcome this problem, methods using a silicone resin sealing agent with high crosslink density have been studied. The silicone resin sealing agent with a high crosslink density has no surface tackiness and thereby can prevent adhesion of foreign matters and damage to the light emitting surface, but has significantly low mechanical strength and provides very poor adhesion. If the silicone resin sealing agent is repeatedly exposed to a heat cycle, cracks will form in the sealing agent, or the sealing agent will be peeled off from a housing material etc. Because of high moisture permeability of the silicone resin, the light emitting properties of the light emitting device may deteriorate through prolonged use. In addition, as the silicone resin is less refractive, an optical semiconductor having a light emitting device sealed with the silicone resin provides insufficient light extraction efficiency.

Although methods in which a silicone resin and an epoxy resin are used in combination to cover the disadvantages of each resin have been studied to overcome these problems, sufficient performance has not been achieved yet.

The light emitting devices are sealed with a sealing agent, for example, by a method comprising: filling a frame having light emitting devices, etc. disposed therein with the sealing agent without leaving any space around the light emitting devices; and curing the sealing agent. The conventional sealing agents cannot stably maintain their shape when charged into the frame, and thereby cured products of the sealing agent sealing the light emitting device problematically show variations in the shape.

Recently, application of the optical semiconductor devices, for example, to backlights for liquid crystals, headlights for vehicles, and general lighting instruments has been examined. In such application, a sealing agent containing a yellow phosphor is used with a blue light emitting device to generate white light (see, for example, Patent Documents 3 and 4). A sealing agent containing a yellow phosphor and a red phosphor is also used to improve color rendering properties. Various combinations of a light emitting device and a phosphor have been actively studied to generate white light.

However, these sealing agents containing a phosphor show deterioration of the viscosity when being cured by heating, and thereby may cause sedimentation of the phosphor therein. As a result, the color of light to be generated may be problematically non-uniform. The problem of non-uniform color is fatal, particularly for lighting use.

For example, a sealing agent prepared to have high viscosity at room temperature may avoid deterioration of the viscosity caused by heating, and thereby prevent sedimentation of the phosphor.

However, such a sealing agent having high viscosity at room temperature causes problems such as incomplete sealing, variations in the discharge amount of the sealing agent, elongation of the sealing process because the flowability of the sealing agent is insufficient for sealing.

Patent Document 1: Japanese Kokai Publication 2003-277473 (JP-A 2003-277473)
Patent Document 2: Japanese Kokai Publication 2003-73452 (JP-A 2003-73452)
Patent Document 3: Japanese Kokai Publication 2002-314142 (JP-A 2002-314142)
Patent Document 4: Japanese Kokai Publication 2004-127988 (JP-A 2004-127988)

DISCLOSURE OF THE INVENTION

Problems to be Solved by the Invention

In view of the above-mentioned state of the art, it is an object of the present invention to provide a highly transparent, heat-resistant and light-resistant sealing agent for an optical semiconductor device which provides excellent adhesion, and is capable of stably maintain its shape and preventing sedimentation of a phosphor when used to seal a light emitting device of an optical semiconductor device. A further object of the present invention is to provide an optical semiconductor device formed by using the sealing agent for an optical semiconductor device.

Means for Solving the Problems

The present invention provides a sealing agent for an optical semiconductor device, which comprises: a silicone resin having a cyclic ether-containing group in the molecular structure; a heat curing agent capable of reacting with the cyclic ether-containing group; and a fine particulate material of silicon oxide, and the sealing agent having a viscosity of 500 to 10,000 mPa·s measured using an E-type viscometer at 25° C. at 5 rpm, a thixotropic value of 1.2 to 2.5 calculated by dividing a viscosity measured using the E-type viscometer at 25° C. at 1 rpm by a viscosity measured at 10 rpm (viscosity at 1 rpm/viscosity at 10 rpm), and a minimum viscosity of 100 mPa·s or higher measured at 1 s$^{-1}$ in the temperature range of 25° C. to a curing temperature using a parallel plate rheometer.

Hereinafter, the present invention will be described in detail.

The present inventors intensively studied and found out that a sealing agent for sealing a light emitting device of an optical semiconductor device which contains a silicone resin having a cyclic ether-containing group in the molecular structure shows various excellent properties and performances such as transparency, heat resistance, light resistance, and adhesion.

The present inventors further intensively studied and found out that a sealing agent for sealing a light emitting device of an optical semiconductor device which has a specific viscosity properties is capable of stably maintaining its shape when used to seal a light emitting device of an optical semiconductor device, and preventing non-uniformity of the color of generated light even when a phosphor is mixed therewith. Thus, the present inventors completed the present invention.

The viscosity of the sealing agent for an optical semiconductor device of the present invention measured at 25° C. at 5 rpm using the E-type viscometer has a lower limit of 500 mPa·s and an upper limit of 10,000 mPa·s. If the sealing agent for an optical semiconductor device of the present invention has a viscosity of lower than 500 mPa·s measured at 25° C. at 5 rpm using the E-type viscometer, the sealing agent may not be capable of maintaining its shape and problematically cause dropping when used to seal a light emitting device of an optical semiconductor device. This may lead to low production efficiency and low yield. The minimum viscosity of such a sealing agent in the temperature range of 25° C. to the curing temperature tends to be 100 mPa·s or below. If the sealing agent for an optical semiconductor device of the present invention has a viscosity of higher than 10,000 mPa·s measured at 25° C. at 5 rpm using the E-type viscometer, sealing of a light emitting device of an optical semiconductor device using the sealing agent may be difficult owing to its excessively high viscosity, and the sealing agent may not be capable of stably maintaining its shape. This may cause variations in the shape of the sealing agent. The preferable lower limit of the viscosity measured at 25° C. at 5 rpm using the E-type viscometer is 600 mPa·s, and the preferable upper limit is 8,000 mPa·s. The more preferable lower limit is 700 mPa·s, and the more preferable upper limit is 5,000 mPa·s.

The "viscosity" used herein is measured at 25° C. using an E-type viscosity meter (TV-22, available from Toki Sangyo Co., Ltd.).

The thixotropic value of the sealing agent for an optical semiconductor device of the present invention has a lower limit of 1.2 and an upper limit of 2.5. If the sealing agent for an optical semiconductor device of the present invention has a thixotropic value of less than 1.2, the sealing agent may cause sedimentation of a phosphor when used to seal a light emitting device of an optical semiconductor device. If the sealing agent for an optical semiconductor device of the present invention has a thixotropic value of more than 2.5, the sealing agent may not be capable of stably maintaining its shape when used to seal a light emitting device of an optical conductor. This may lead to variations in the shape of the sealing agent. The preferable lower limit of the thixotropic value is 1.25, and the preferable upper limit is 2.3. The more preferable lower limit is 1.3, and the preferable upper limit is 2.0.

The "thixotropic value" used herein is calculated by dividing a viscosity of the sealing agent for an optical semiconductor device of the present invention measured using the E-type viscometer at 25° C. at 1 rpm by a viscosity thereof at 10 rpm (viscosity at 1 rpm/viscosity at 10 rpm).

The sealing agent for an optical semiconductor device has a minimum viscosity of 100 mPa·s or higher measured at 1 s$^{-1}$ in the temperature range of 25° C. to a curing temperature using a parallel plate rheometer. A sealing agent for an optical semiconductor device having a minimum viscosity of lower than 100 mPa·s may cause sedimentation of a phosphor when heated to cure. The sedimentation of the phosphor causes non-uniformity of the color of light to be generated. The preferable lower limit of the minimum viscosity is 150 mPa·s, and the more preferable lower limit is 200 mPa·s.

Owing to the above-mentioned viscosity properties, it is possible to significantly stably control the discharge amount of the sealing agent for an optical semiconductor device of the present invention when the sealing agent is used to seal a light emitting device of an optical semiconductor. It is also possible to avoid deterioration of the viscosity and to prevent sedimentation of a phosphor when the sealing agent for an optical semiconductor device of the present invention is cured by heating. Therefore, it is possible to avoid non-uniformity of the color of light to be generated. Accordingly, the sealing agent for an optical semiconductor device of the present invention is suited for sealing a light emitting device of an optical semiconductor device.

The sealing agent for an optical semiconductor device of the present invention contains a silicone resin having a cyclic ether-containing group in the molecular structure.

The silicone resin contained in the sealing agent for an optical semiconductor device of the present invention is not particularly limited, provided that the silicone resin has one or more cyclic ether-containing groups in the molecular structure. Preferred examples thereof include silicone resins containing resin components represented by average chemical composition formula (1).

$$(R^1R^2R^3SiO_{1/2})_a(R^4R^5SiO_{2/2})_b(R^6SiO_{3/2})_c(SiO_{4/2})_d \qquad (1)$$

In formula (1), a, b, c and d satisfy the following formulas: $0 \leq a/(a+b+c+d) \leq 0.2$; $0.3 \leq b/(a+b+c+d) \leq 1.0$; $0 \leq c/(a+b+c+d) \leq 0.5$; and $0 \leq d/(a+b+c+d) \leq 0.3$. At least one of $R^1$ to $R^6$ represents a cyclic ether-containing group, and each of groups other than the group representing the cyclic ether-containing group among $R^1$ to $R^6$ represents a linear or branched $C_{1-8}$ hydrocarbon or a fluorinated compound thereof. These may be the same as or different from one another.

In particular, each of the groups other than the group representing the cyclic ether-containing group among $R^1$ to $R^6$ preferably represents a methyl group or an ethyl group. With a methyl group or an ethyl group at these positions, the temperature dependence curve of the viscosity of the sealing agent for an optical semiconductor device of the present invention shows gradual change. Therefore, the viscosity does not largely decrease when the sealing agent is heated. Therefore, it is possible to prevent sedimentation of a phosphor when the sealing agent for an optical semiconductor device of the present invention is used to seal a light emitting device. As a result, it is possible to avoid non-uniformity of the color of light to be generated.

With a methyl group or an ethyl group at the positions of the groups other than the group representing the cyclic ether-containing group among $R^1$ to $R^6$, the interaction between the molecules of the sealing agent for an optical semiconductor device of the present invention is low. Therefore the intermolecular force does not decrease sharply with an increase in temperature, which results in a smaller change in the viscosity. For this reason, the sealing agent for an optical semiconductor device of the present invention having a methyl group or an ethyl group at the positions of the groups other than the cyclic ether-containing group among $R^1$ to $R^6$ can avoid decrease in the viscosity caused by heating the sealing agent.

In particular, all the groups other than the cyclic ether-containing group among $R^1$ to $R^6$ are more preferably methyl groups. With this structure, the sealing agent for an optical semiconductor device of the present invention can more efficiently avoid decrease in the viscosity.

With silicone resin containing the resin components represented by average chemical composition formula (1), the sealing agent for an optical semiconductor device of the present invention has high transmittance of light of a short wavelength in the blue to ultraviolet region. When used as a sealing agent for an optical semiconductor device, the sealing agent can avoid discoloration caused by heat or light emitted from the light emitting device sealed therewith, and is excellent in heat resistance and light resistance. When used to seal a light emitting device of an optical semiconductor device such as a light emitting diode, the sealing agent excellently adhere to a housing material, etc. in the optical semiconductor device.

The expression "represented by average chemical composition formula (1)" means not only that the sealing agent for an optical semiconductor device of the present invention contains only a resin component represented by formula (1), but also that the sealing agent for an optical semiconductor device of the present invention is a mixture containing some resin components of various structures whose average chemical composition formula is represented by formula (1).

At least one of $R^1$ to $R^6$ represents a cyclic ether-containing group in formula (1).

The cyclic ether-containing group is not particularly limited, and examples thereof include glycidyl-containing groups, epoxycyclohexyl-containing groups, and oxetane-containing groups. The glycidyl-containing groups and/or epoxycyclohexyl-containing groups are suitable among these.

In the description, the cyclic ether-containing group may be any group, provided that it contains a cyclic ether structure at least as part of the group. Examples thereof include a group having a cyclic ether group and another backbone such as an alkyl group or alkyl ether group.

The glycidyl-containing groups are not particularly limited, and examples thereof include 2,3-epoxypropyl group, 3,4-epoxybutyl group, 4,5-epoxypentyl group, 2-glycidoxyethyl group, 3-glycidoxypropyl group, and 4-glycidoxybutyl group.

The epoxycyclohexyl-containing group is not particularly limited, and examples thereof include 2-(3,4-epoxycyclohexyl)ethyl group and 3-(3,4-epoxycyclohexyl)propyl group.

The cyclic ether-containing-group content of the silicone resin preferably has a lower limit of 0.1 mol % and an upper limit of 50 mol %. At a cyclic ether-containing-group content of lower than 0.1 mol %, the silicone resin may be considerably less reactive with a heat curing agent described below, and thereby the sealing agent for an optical semiconductor device of the present invention may insufficiently cure. At a cyclic ether-containing-group content of higher than 50 mol %, the heat resistance of the sealing agent for an optical semiconductor device of the present invention may be low as a larger number of cyclic ether-containing groups are not involved in the reaction between the silicone resin and the heat curing agent. The lower limit of the cyclic ether-containing-group content is more preferably 1 mol %, and further more preferably 5 mol %, and the upper limit is more preferably 40 mol %, and further more preferably 30 mol %.

The "cyclic ether-containing-group content" used herein is defined as the amount of the cyclic ether-containing group in the average chemical composition of the silicone components.

In the silicone resin represented by formula (1), each of the groups other than the group representing the cyclic ether-containing group among $R^1$ to $R^6$ represents a linear or branched $C_{1-8}$ hydrocarbon or a fluorinated compound thereof.

The linear or branched $C_{1-8}$ hydrocarbon is not particularly limited, and examples thereof include methyl group, ethyl group, n-propyl group, n-butyl group, n-pentyl group, n-hexyl group, n-heptyl group, n-octyl group, isopropyl group, isobutyl group, sec-butyl group, t-butyl group, isopentyl group, neopentyl group, t-pentyl group, isohexyl group, cyclohexyl group, and phenyl group.

Among them, methyl group and ethyl group are preferable as they facilitate control of deterioration of the viscosity of the sealing agent for an optical semiconductor device of the present invention with an increase in temperature.

The structure unit (hereinafter, referred to a bifunctional structure unit) represented by the formula $R^4R^5SiO_{2/2}$ in the silicone resin represented by formula (1) include structures represented by formula (1-2), that is, structures in which one oxygen atom among the oxygen atoms linked to the silicon atom in the bifunctional structure unit is part of a hydroxy or alkoxy group.

$$(R^4R^5SiXO_{1/2}) \qquad (1\text{-}2)$$

In formula (1-2), X represents OH or OR, and OR represents a linear or branched $C_{1-4}$ alkoxy group.

The structure unit (hereinafter, referred to a trifunctional structure unit) represented by the formula $R^6SiO_{3/2}$ in the silicone resin represented by formula (1) include structures represented by formula (1-3) and (1-4), that is, structures in which two oxygen atoms among the oxygen atoms linked to the silicon atom in the trifunctional structure unit are part of a hydroxy or alkoxy group, and structures in which one oxygen atom among the oxygen atoms linked to the silicon atom in the trifunctional structure is part of a hydroxy or alkoxy group.

$$(R^6SiX_2O_{1/2}) \qquad (1\text{-}3)$$

$$(R^6SiXO_{2/2}) \qquad (1\text{-}4)$$

In formulas (1-3) and (1-4), X represents OH or OR, and OR represents a linear or branched $C_{1-4}$ alkoxy group.

The structure unit (hereinafter, referred to tetrafunctional structure unit) represented by the formula $SiO_{4/2}$ in the silicone resin represented by formula (1) include structures represented by formulas (1-5), (1-6) and (1-7), that is, structures in which two or three oxygen atoms among the oxygen atoms linked to the silicon atom in the tetrafunctional structure unit are part of a hydroxy or alkoxy group, and structures in which one oxygen atom among the oxygen atoms linked to the silicon atom in the tetrafunctional structure unit is part of a hydroxy or alkoxy group.

$$(SiX_3O_{1/2}) \qquad (1\text{-}5)$$

$$(SiX_2O_{2/2}) \qquad (1\text{-}6)$$

$$(SiXO_{3/2}) \qquad (1\text{-}7)$$

In formulas (1-5), (1-6) and (1-7), X represents OH or OR, and OR represents a linear or branched $C_{1-4}$ alkoxy group.

The linear or branched $C_{1-4}$ alkoxy group in formulas (1-2) to (1-7) is not particularly limited, and examples thereof include methoxy group, ethoxy group, n-propoxy group, n-butoxy group, isopropoxy group, isobutoxy group, sec-butoxy group, and t-butoxy group.

In formula (1), a is a value that satisfies the formula $0 \leq a/(a+b+c+d) \leq 0.2$. If $a/(a+b+c+d)$ is larger than 0.2, the sealing agent for an optical semiconductor device of the present invention may have low heat resistance. The more preferable upper limit of $a/(a+b+c+d)$ is 0.15, and the further more preferable upper limit is 0:1.

In formula (1), b is a value that satisfies the formula $0.3 \leq b/(a+b+c+d) \leq 1.0$. If $b/(a+b+c+d)$ is less than 0.3, a cured product of the sealing agent for an optical semiconductor device of the present invention may be too hard, and thereby cracks, etc. may occur therein. The more preferable lower limit of $b/(a+b+c+d)$ is 0.4, and the further more preferable lower limit is 0.5.

In formula (1), c is a value that satisfies the formula $0 \leq c/(a+b+c+d) \leq 0.5$. If $c/(a+b+c+d)$ is more than 0.5, the viscosity of the sealing agent for an optical semiconductor device of the present invention may not be in the proper range, and the sealing agent may provide deteriorated adhesion. The more preferable upper limit of $c/(a+b+c+d)$ is 0.4, and the further more preferable upper limit is 0.3.

In formula (1), d is a value that satisfies the formula $0 \leq d/(a+b+c+d) \leq 0.3$. If $d/(a+b+c+d)$ is more than 0.3, the viscosity of the sealing agent for an optical semiconductor device of the present invention may not be in the proper range, and the sealing agent may provide deteriorated adhesion. The more preferable upper limit of $d/(a+b+c+d)$ is 0.2, and the further more preferable upper limit is 0.1.

Results of $^{29}$Si-nuclear magnetic resonance analysis (hereinafter, referred to as NMR) on silicone resins represented by formula (1) using tetramethyl silane (hereinafter, referred as TMS) as a standard show that the peak corresponding to the structure unit of $(R^1R^2R^3SiO_{1/2})_a$ in formula (1), the peaks corresponding to the structure unit of $(R^4R^5SiO_{2/2})_b$ in formula (1) and the bifunctional structure unit in formula (1-2), the peaks corresponding to the structure unit of $(R^6SiO_{3/2})_c$ in formula (1) and the trifunctional structure units in formulas (1-3) and (1-4), and the peaks corresponding to $(SiO_{4/2})_d$ in formula (1) and the tetrafunctional structure units in formulas (1-5), (1-6) and (1-7) appear around +10 to 0 ppm, −10 to −30 ppm, −50 to −70 ppm, and −90 to −120 ppm, respectively, although small variations are observed depending on the difference of the substituent.

Therefore, the ratio in formula (1) can be determined by performing $^{29}$Si-NMR and comparing the peak areas of the respective signals.

In the case where each functional structure unit in (1) cannot be identified by $^{29}$Si-NMR analysis using TMS as a standard, the ratio of the structure units can be determined using results obtained by $^1$H-NMR, $^{19}$F-NMR or the like, if needed, as well as results of $^{29}$Si-NMR.

The silicone resin preferably has the structure unit of $R^7R^8SiO_{2/2}$, and the structure unit of $R^9SiO_{3/2}$ and/or the structure unit of $SiO_{4/2}$. With the structure unit of $R^7R^8SiO_{2/2}$, and the structure unit of $R^9SiO_{3/2}$ and/or the structure unit of $SiO_{4/2}$, the sealing agent for an optical semiconductor device of the present invention has further enhanced heat resistance and can avoid problems such as decrease in the thickness under use conditions. The silicone resin having these structures provides further strong interaction with the fine particulate material of silicon oxide, and thereby can prevent deterioration of the viscosity with an increase in temperature of the sealing agent for an optical semiconductor device of the present invention. The silicone resin optionally has the structure unit of $SiO_{4/2}$, and this structure facilitates adjustment of the viscosity of the sealing agent for an optical semiconductor device of the present invention in the desired range. It should be noted that a silicone resin containing only the structure unit of $R^7R^8SiO_{2/2}$ among the above-mentioned structure units may have insufficient heat resistance, and may be insufficiently three-dimensionally cross-linked, and that a cured product thereof may exhibit decrease in the thickness.

The expression "decrease in the thickness" used herein means a phenomenon in which the thickness of a cured product gradually decreases when the product is exposed to high temperature.

At least one of $R^7$ to $R^9$ represents the cyclic ether-containing group, and each of the groups other than the group representing the cyclic ether-containing group among $R^7$ to $R^9$ represents a linear or branched $C_{1-8}$ hydrocarbon or a fluorinated compound thereof. These may be the same as or different from one another. Examples of $R^7$ to $R^9$ include those listed for $R^4$ to $R^6$. Examples of the structure units of $R^7R^8SiO_{2/2}$, $R^9SiO_{3/2}$, and $SiO_{4/2}$ include the same structures as the bifunctional structure units, the trifunctional structure units, and the tetrafunctional structure units represented by formulas (1-2) to (1-7).

The structure having the structure unit of $R^7R^8SiO_{2/2}$, and the structure unit of $R^9SiO_{3/2}$ and/or the structure unit of $SiO_{4/2}$ in the sealing agent for an optical semiconductor device of the present invention may be formed by using a resin having the structure unit of $R^7R^8SiO_{2/2}$, and the structure unit of $R^9SiO_{3/2}$ and/or the structure unit of $SiO_{4/2}$ in the molecular backbone in the uncured state, or using a resin mixture of a resin having only the structure unit of $R^7R^8SiO_{2/2}$, and a resin having the structure unit of $R^9SiO_{3/2}$ and/or the structure unit of $SiO_{4/2}$. In particular, use of a resin having the structure units of $R^7R^8SiO_{2/2}$ and $R^9SiO_{3/2}$ in the molecular backbone is preferable.

The resin having the structure units of $R^7R^8SiO_{2/2}$ and $R^9SiO_{3/2}$ in the molecular backbone may be a resin represented by formula (1) in which a and d are 0. In this case, the lower limit of $b/(a+b+c+d)$ is preferably 0.5, and more preferably 0.6, and the upper limit thereof is preferably 0.95, and more preferably 0.9 (hereinafter, also referred to as Condition (1)). The lower limit of $c/(a+b+c+d)$ is preferably 0.05, and more preferably 0.1, and the upper limit thereof is preferably 0.5, and more preferably 0.4 (hereinafter, also referred to as Condition (2)).

The silicone resin preferably contains resin components represented by the average chemical composition formula (2), (3) or (4). The silicone resin containing resin components represented by average chemical composition formula (2), (3) or (4) in the sealing agent for an optical semiconductor device of the present invention includes silicone resins containing only a resin component represented by formula (2), (3) or (4), and silicone resins containing a mixture of some resin components of various structures whose average formula is represented by formula (2), (3) or (4).

$$(R^{10}R^{11}SiO_{2/2})_e(R^{12}SiO_{3/2})_f \quad (2)$$

In formula (2), e and f satisfy the formulas: $0.5 \leq e/(e+f) \leq 0.95$ and $0.05 \leq /(e+f) \leq 0.5$. At least one of $R^{10}$ to $R^{12}$ represents a cyclic ether-containing group, and each of the groups other than the group representing the cyclic ether-containing group among $R^{10}$ to $R^{12}$ represents a linear or branched $C_{1-8}$ hydrocarbon, or a fluorinated compound thereof. These may be the same as or different from one another.

$$(R^{13}R^{14}SiO_{2/2})_g(R^{15}R^{16}SiO_{2/2})_h(R^{17}SiO_{3/2})_i \quad (3)$$

In formula (3), g, h and i satisfy the formulas: $0.5 \leq (g+h)/(g+h+i) \leq 0.95$; and $0.05 \leq i/(g+h+i) \leq 0.5$. At least one of $R^{13}$ to $R^{17}$ represents a cyclic ether-containing group, and each of the groups other than the group representing the cyclic ether-containing group among $R^{13}$ to $R^{17}$ represents a linear or branched $C_{1-8}$ hydrocarbon, or a fluorinated compound thereof. However, the structures of $(R^{13}R^{14}SiO_{2/2})$ and $(R^{15}R^{16}SiO_{2/2})$ are different from one another.

$$(R^{18}R^{19}SiO_{2/2})_j(R^{20}SiO_{3/2})_k(R^{21}SiO_{3/2})_l \quad (4)$$

In formula (4), j, k and l satisfy the formulas: $0.5 \leq j/(j+k+l) \leq 0.95$; and $0.05 \leq (k+l)/(j+k+l) \leq 0.5$. At least one of $R^{18}$ to $R^{21}$ represents a cyclic ether-containing group, and each of the groups other than the group representing the cyclic ether-containing group among $R^{18}$ to $R^{21}$ represents a linear or branched $C_{1-8}$ hydrocarbon, or a fluorinated compound thereof. However, the structures of $(R^{20}SiO_{3/2})$ and $(R^{21}SiO_{3/2})$ are different from one another.

In formulas (2) to (4), the cyclic ether-containing group preferably has either glycidyl group or epoxycyclohexyl group.

The silicone resin preferably has the cyclic ether-containing groups in the trifunctional structure unit in the structure unit represented by formula (2), (3) or (4). Specifically, the silicone resin preferably has the cyclic ether-containing group at $R^{12}$ in formula (2), $R^{17}$ in formula (3), or $R^{20}$ and/or $R^{21}$ in formula (4).

The cyclic ether-containing group contained in the trifunctional structure unit tends to be located outside the polysiloxane backbone in the silicone resin. With this structure, the sealing agent for an optical semiconductor device of the present invention cures to form a sufficiently three-dimensionally cross-linked structure with sufficient heat resistance. This structure is advantageous for preventing decrease in the thickness of the cured product.

The silicone resin preferably has an alkoxy group in an amount of 0.5 to 10 mol %. With such an amount of the alkoxy group, the sealing agent for an optical semiconductor device of the present invention has strikingly improved heat resistance and light resistance. This may be because the alkoxy group in the silicone resin strikingly accelerates the curing rate of the sealing agent for an optical semiconductor device of the present invention, which enables the sealing agent to cure without heat deterioration.

A curing accelerator is added, if needed. As the curing rate is accelerated, a comparatively small amount of the curing accelerator is enough to sufficiently cure the sealing agent.

With less than 0.5 mol % of the alkoxy group, a sufficient curing rate of the sealing agent for an optical semiconductor device of the present invention may not be achieved, which in turn leads to deterioration of heat resistance of the sealing agent. With more than 10 mol % of the alkoxy group, the silicone resin or composition may have low store stability, and the sealing agent may have low heat resistance. The more preferable lower limit of the amount of the alkoxy group is 1 mol %, and the more preferable upper limit is 5 mol %.

The "amount of the alkoxy group" used herein is defined as the amount of the alkoxy group contained in the average chemical composition of the silicone resin components.

The silicone resin preferably contains no silanol group. Silanol group is unfavorable because silanol group-containing polymers have remarkably low storage stability, and a resin composition made of the polymers has remarkably low storage stability. The number of silanol groups can be reduced by heating under vacuum, and the amount of silanol group can be determined using infrared spectroscopy or the like.

In the sealing agent for an optical semiconductor device of the present invention, the number average molecular weight (Mn) of the silicone resin preferably has a lower limit of 1,000 and an upper limit is 50,000. If the silicone resin has a number average molecular weight (Mn) of less than 1,000, the sealing agent for an optical semiconductor device of the present invention may contain larger amounts of components that volatilize upon heat-curing, and the cured product thereof may disadvantageously exhibit decrease in the thickness when used as a sealing agent. If the silicone resin has a number average molecular weight (Mn) of more than 50,000, adjustment of the viscosity of the sealing agent for an optical semiconductor device of the present invention may be disadvantageously difficult. The more preferable lower limit of the number average molecular weight (Mn) of the silicone resin is 1,500, and the more preferable upper limit is 15,000.

The number average molecular weight (Mn) used herein is determined by gel permeation chromatography (GPC) (polystyrene standards), and specifically determined by using a measuring device produced by Waters with two columns (column: Shodex GPC LF-804 (300 mm in length×2), available from Showa Denko K.K.; temperature: 40° C.; flow rate: 1 mL/min; solvent: tetrahydrofuran; and standard substance: polystyrene).

A method for synthesizing the silicone resin is not particularly limited, and examples thereof include (1) a method in which a substituent is introduced by a hydrosilylation reaction between a silicone resin having an SiH group and a vinyl compound having the cyclic ether-containing group, (2) a method in which a siloxane compound is condensation-reacted with a siloxane compound having the cyclic ether-containing group.

In the method (1), the hydrosilylation reaction is a reaction of the SiH group with the vinyl group in the presence of a catalyst, if necessary.

Examples of the silicone resin having an SiH group include those having an SiH group in the molecular structure and a structure represented by formula (1), or preferably a structure represented by any one of average chemical composition formulas (2) to (4) after the reaction with the vinyl compound having the cyclic ether-containing group.

The vinyl compound having the cyclic ether-containing group is not particularly limited, provided that it contains one or more cyclic ether-containing groups in the molecular structure. Examples thereof include epoxy group-containing compounds such as vinyl glycidyl ether, allyl glycidyl ether, glycidyl methacrylate, glycidyl acrylate, and vinyl cyclohexene oxide.

Examples of the siloxane compound used in the method (2) include alkoxysilanes having a siloxane unit represented by formula (5), (6), (7) or (8), and partial hydrolysates thereof.

$$R^{22}R^{23}R^{24}Si(OR) \quad (5)$$

$$R^{25}R^{26}Si(OR)_2 \quad (6)$$

$$R^{27}Si(OR)_3 \quad (7)$$

$$Si(OR)_4 \quad (8)$$

In formulas (5) to (8), $R^{22}$ to $R^{27}$ individually represent a linear or branched $C_{1-8}$ hydrocarbon, or a fluorinated compound thereof, and OR represents a linear or branched $C_{1-4}$ alkoxy group.

Examples of the linear or branched $C_{1-8}$ hydrocarbon at $R^{22}$ to $R^{27}$ in formulas (5) to (8) include, specifically, methyl group, ethyl group, n-propyl group, n-butyl group, n-pentyl group, n-hexyl group, n-heptyl group, n-octyl group, isopropyl group, isobutyl group, sec-butyl group, t-butyl group, isopentyl group, neopentyl group, t-pentyl group, isohexyl group, cyclohexyl group, and phenyl group.

Examples of the linear or branched $C_{1-4}$ alkoxy group represented by OR in formulas (5) to (8) include, specifically, methoxy group, ethoxy group, n-propoxy group, n-butoxy group, isopropoxy group, isobutoxy group, sec-butoxy group, and t-butoxy group.

Examples of the compound represented by formula (5) include, specifically, trimethylmethoxysilane, trimethylethoxysilane, triphenylmethoxysilane, and triphenylethoxysilane.

Examples of the compound represented by formula (6) include, specifically, dimethyldimethoxysilane, dimethyldiethoxysilane, diphenyldimethoxysilane, diphenyldiethoxysilane, isopropyl(methyl)dimethoxysilane, cyclohexyl(methyl)dimethoxysilane, and methyl(phenyl)dimethoxysilane.

Examples of the compound represented by formula (7) include, specifically, methyltrimethoxysilane, methyltriethoxysilane, ethyltrimethoxysilane, ethyltriethoxysilane, hexyltrimethoxysilane, octyltrimethoxysilane and phenyltrimethoxysilane.

Examples of the compound represented by formula (8) include, specifically, tetramethoxysilane and tetraethoxysilane.

Examples of the siloxane compound having the cyclic ether-containing group include alkoxysilanes having the cyclic ether-containing group represented by formula (9), (10) or (11) and partial hydrolysates thereof.

$$R^{28}R^{29}R^{30}Si(OR) \quad (9)$$

$$R^{31}R^{32}Si(OR)_2 \quad (10)$$

$$R^{33}Si(OR)_3 \quad (11)$$

At least one of $R^{28}$, $R^{29}$ and $R^{30}$ in formula (9), $R^{31}$ and/or $R^{32}$ in formula (10), and $R^{33}$ in formula (11) represent the cyclic ether-containing group, and the groups other than the groups representing the cyclic ether-containing group among $R^{28}$, $R^{29}$, $R^{30}$, $R^{31}$ and $R^{32}$ represent a linear or branched $C_{1-8}$ hydrocarbon or a fluorinated compound thereof. OR represents a linear or branched $C_{1-4}$ alkoxy group.

The cyclic ether-containing group represented by at least one of $R^{28}$, $R^{29}$ and $R^{30}$, and $R^{31}$ and/or $R^{32}$, and $R^{33}$ is not particularly limited, and examples thereof include glycidyl-containing groups, epoxycyclohexyl-containing groups and oxetane-containing groups. Among them, the glycidyl-containing groups and/or epoxycyclohexyl-containing groups are preferable.

The glycidyl-containing groups are not particularly limited, and examples thereof include 2,3-epoxypropyl group, 3,4-epoxybutyl group, 4,5-epoxypentyl group, 2-glycidoxyethyl group, 3-glycidoxypropyl group, and 4-glycidoxybutyl group.

The epoxycyclohexyl-containing groups are not particularly limited, and examples thereof include 2-(3,4-epoxycyclohexyl)ethyl group and 3-(3,4-epoxycyclohexyl)propyl group.

Examples of the groups other than the group representing the cyclic ether-containing group among $R^{28}$, $R^{29}$, $R^{30}$, $R^{31}$ and $R^{32}$ in formulas (9) and (10) include, specifically, methyl group, ethyl group, n-propyl group, n-butyl group, n-pentyl group, n-hexyl group, n-heptyl group, n-octyl group, isopropyl group, isobutyl group, sec-butyl group, t-butyl group, isopentyl group, neopentyl group, t-pentyl group, isohexyl group, cyclohexyl group, and phenyl group.

Examples of the linear or branched $C_{1-4}$ alkoxy group at OR in formulas (9), (10) and (11) include, specifically, methoxy group, ethoxy group, n-propoxy group, n-butoxy group, isopropoxy group, isobutoxy group, sec-butoxy group, and t-butoxy group.

Examples of the compound represented by formula (9) include, specifically, 3-glycidoxypropyl(dimethyl)methylmethoxysilane and 2-(3,4-epoxycyclohexyl)ethyl(dimethyl)methoxysilane.

Examples of the compound represented by formula (10) include, specifically, 3-glycidoxypropyl(methyl)dimethoxysilane, 3-glycidoxypropyl(methyl)diethoxysilane, 3-glycidoxypropyl(methyl)dibutoxysilane, 2,3-epoxypropyl(methyl)dimethoxysilane, 2-(3,4-epoxycyclohexyl)ethyl(methyl)dimethoxysilane, and 2-(3,4-epoxycyclohexyl)ethyl(methyl)diethoxysilane.

Examples of the compound represented by formula (11) include, specifically, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane.

Examples of the method (2) in which the siloxane compound is condensation-reacted with the siloxane compound having the cyclic ether-containing group include, specifically, a method in which the silicone resin is synthesized by reacting the siloxane compound with the compound having the cyclic ether-containing group in the presence of water and an acidic or basic catalyst.

The amount of water to be used in the above-mentioned method is not particularly limited, and appropriately adjusted to an amount that is sufficient for hydrolysis of the siloxane compound and the alkoxy group linked to the silicon atom in the siloxane compound having the cyclic ether-containing group.

The acidic catalyst causes the reaction between the siloxane compound and the siloxane compound having the cyclic ether-containing group, and examples thereof include inorganic acids, organic acids, acid anhydrides, and derivatives thereof.

Examples of the inorganic acids include phosphoric acid, boric acid and carbonic acid.

Examples of the organic acids include formic acid, acetic acid, propionic acid, butyric acid, lactic acid, malic acid, tartaric acid, citric acid, oxalic acid, malonic acid, succinic acid, glutaric acid, adipic acid, fumaric acid, maleic acid, and oleic acid.

The basic catalyst causes the reaction between the siloxane compound and the siloxane compound having the cyclic ether-containing group, and examples thereof include hydroxides of alkaline metals, alcoxides of alkaline metals, and silanol compounds of alkaline metals.

Examples of the hydroxides of alkaline metals include sodium hydroxide, potassium hydroxide, and cesium hydroxide.

Examples of the alcoxides of alkaline metals include sodium-t-butoxide, potassium-t-butoxide, and cesium-t-butoxide.

Examples of the silanol compounds of alkaline metals include sodium silanolate compounds, potassium silanolate compounds, and cesium silanolate compounds.

Among them, the potassium-containing catalysts and cesium-containing catalysts are preferable.

The sealing agent for an optical semiconductor device of the present invention preferably contains a bifunctional silicone resin having one or more glycidyl-containing groups in the molecular structure.

With such a bifunctional silicone resin, a cured product of the sealing agent for an optical semiconductor device of the present invention has strikingly improved crack resistance. This may be because, in the cured product, the bifunctional silicone resin has a more flexible backbone than that of the silicone resin having a cyclic ether-containing group in the molecular structure, and intrudes into a gap between crosslinking portions formed in the reaction of the cyclic ether-containing group of the silicone resin having a cyclic ether-containing group.

The "glycidyl-containing groups" used herein may be any groups, provided that they have a glycidyl group at least as part thereof. For example, the glycidyl-containing groups may have a glycidyl group and another backbone such as alkyl group and alkyl ether group.

The glycidyl-containing groups are not particularly limited, and examples thereof include 2,3-epoxypropyl group, 3,4-epoxybutyl group, 4,5-epoxypentyl group, 2-glycidoxyethyl group, 3-glycidoxypropyl group, and 4-glycidoxybutyl group.

The bifunctional silicone resin having one or more glycidyl-containing group in the molecular structure is not particularly limited, but preferably contains resin components represented by average chemical composition formula (12) or (13). With the bifunctional silicone resin containing the resin component represented by formula (12) or (13), a cured product of the sealing agent for an optical semiconductor device of the present invention has adequate flexibility, and thereby has remarkably improved crack resistance.

The bifunctional silicone resin represented by average formula (12) or (13) in the sealing agent for an optical semiconductor device of the present invention includes bifunctional silicone resins containing only a resin component represented by formula (12) or (13), and bifunctional silicone resins containing a mixture of some resin components of various structures whose average formula is represented by formula (12) or (13).

The structures represented by formulas (12) and (13) include the structures represented by formula (1-2).

$(R^{34}R^{35}SiO_{2/2})_m(R^{36}R^{37}SiO_{2/2})_n$ \hfill (12)

In formula (12), $R^{36}$ and/or $R^{37}$ represent a glycidyl-containing group. $R^{34}$ and $R^{35}$ individually represent a $C_{1-8}$ hydrocarbon or a fluorinated compound thereof, and these may be the same as or different from one another. When either $R^{36}$ or $R^{37}$ represents the glycidyl-containing group, the other represents a $C_{1-8}$ hydrocarbon or a fluorinated compound thereof. The lower limit of m/(m+n) is preferably 0.6, and more preferably 0.7, and the upper limit thereof is preferably 0.95, and more preferably 0.9. The lower limit of n/(m+n) is preferably 0.05, and more preferably 0.1, and the upper limit thereof is preferably 0.4, and more preferably 0.3.

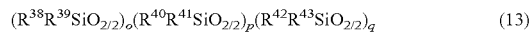

$(R^{38}R^{39}SiO_{2/2})_o(R^{40}R^{41}SiO_{2/2})_p(R^{42}R^{43}SiO_{2/2})_q$ \hfill (13)

In formula (13), $R^{42}$ and/or $R^{43}$ represent a glycidyl-containing group. $R^{38}$, $R^{39}$, $R^{40}$ and $R^{41}$ individually represent a $C_{1-8}$ hydrocarbon or a fluorinated compound thereof. These may be the same as or different from one another. When either $R^{42}$ or $R^{43}$ represents the glycidyl-containing group, the other represents a $C_{1-8}$ hydrocarbon or a fluorinated compound thereof. The lower limit of o+p/(o+p+q) is preferably 0.6, and more preferably 0.7, and the upper limit thereof is preferably 0.95, and more preferably 0.9. The lower limit of q/(o+p+q) is preferably 0.05, and more preferably 0.1, and the upper limit thereof is preferably 0.4, and more preferably 0.3. The structures of $(R^{38}R^{39}SiO_{2/2})$ and $(R^{40}R^{41}SiO_{2/2})$ are different from each other.

The number average molecular weight (Mn) of the bifunctional silicone resin has preferably a lower limit of 1,500 and an upper limit of 50,000. If the bifunctional silicone resin has a number average molecular weight (Mn) of less than 1,500, a cured product of the sealing agent for an optical semiconductor device of the present invention may have insufficient crack resistance. If the bifunctional resin has a number average molecular weight (Mn) of more than 50,000, adjustment of the viscosity of the sealing agent for an optical semiconductor device of the present invention may be difficult. The more preferable lower limit of the number average molecular weight (Mn) of the bifunctional silicone resin is 2,000, and the more preferable upper limit is 20,000.

A method for synthesizing the bifunctional silicone resin is not particularly limited, and examples thereof include methods similar to the methods for synthesizing the silicone resin, that is, a method in which a substituent is introduced by a hydrosilylation reaction between a silicone resin (b) having an SiH group with a vinyl compound having the glycidyl-containing group (method (3)), and a method in which an alkoxysilane compound is condensation-reacted with an alkoxysilane compound having the glycidyl-containing group (method (4)).

Examples of the silicone resin (b) having an SiH group used to synthesize the bifunctional silicone resin by the method (3) include silicone resins having an SiH group in the molecular structure and a structure represented by formula (12) or (13) after the reaction with the vinyl compound having the glycidyl-containing group.

The alkoxysilane compound used to synthesize the bifunctional silicone resin by method (4) is not particularly limited, and examples thereof include the same compounds as those represented by formula (6).

Examples of the alkoxysilane compound having the glycidyl-containing group include the same compounds as those represented by formula (10).

Example of a method for condensation-reacting the alkoxysilane compound and the alkoxysilane compound having the glycidyl-containing group include, specifically, methods similar to the methods for synthesizing the silicone resin in which an alkoxysilane compound is reacted with an alkoxysilane compound having the cyclic ether-containing group.

The amount of the bifunctional silicone resin to be used with respect to the amount of the silicone resin contained in the sealing agent for an optical semiconductor device is not particularly limited, but preferably has a lower limit of 10 parts by weight and an upper limit of 120 parts by weight with respect to 100 parts by weight of the silicone resin. With less than 10 parts by weight of the bifunctional silicone resin, a cured product of the sealing agent for an optical semiconductor device of the present invention may have insufficient crack resistance. With more than 120 parts by weight of the bifunctional silicone resin, a cured product of the sealing agent for an optical semiconductor device of the present invention may have low heat resistance, and is likely to turn yellow under heat environment. The more preferable lower limit of the amount of the bifunctional silicone resin to be used is 15 parts by weight, and the more preferable upper limit is 100 parts by weight.

The preferable lower limit of the total amount of the silicone resin and the bifunctional silicone resin in the sealing agent for an optical semiconductor device of the present invention is 90 parts by weight with respect to 100 parts by weight of all the resin components. The more preferable lower limit of the total amount of the silicone resin and the bifunctional silicone resin is 95 parts by weight, the further more preferable lower limit is 97 parts by weight, and the still further more preferable lower limit is 99 parts by weight.

The sealing agent for an optical semiconductor device of the present invention may contain a curing compound capable of reacting with an epoxy group in addition to the above-mentioned resins as long as the effect of the present invention is not adversely affected. Examples of this compound include compounds having an amino group, urethane group, imide group, hydroxyl group, carboxyl group or epoxy group. Epoxy compounds are preferable among these. The epoxy compounds are not particularly limited, and various conventional epoxy compounds known in the art can be used.

The amount to be used of the optional curing compound capable of reacting with an epoxy group is not particularly limited, but preferably has an upper limit of 10 parts by weight with respect to 100 parts by weight of the total amount of the silicone resins. The more preferable upper limit is 5 parts by weight, the further more preferable upper limit is 3 parts by weight, and the still further more preferable upper limit is 1 part by weight.

The sealing agent for an optical semiconductor device of the present invention contains a heat curing agent capable of reacting with the cyclic ether-containing group (hereinafter, simply referred to as a heat curing agent).

The heat curing agent is not particularly limited, provided that it is capable of reacting with the cyclic ether-containing group in the silicone resin, and examples thereof include: aliphatic amines such as ethylenediamine, triethylenepentamine, hexamethylenediamine, dimer acid modified ethylenediamine, N-ethylaminopiperazine, and isophorone diamine; aromatic amines such as m-phenylenediamine, p-phenylenediamine, 3,3'-diaminodiphenyl sulfone, 4,4'-diaminodiphenyl sulfone, 4,4'-diaminodiphenyl methane, and 4,4'-diaminodiphenyl ether; mercaptans such as mercaptopropionic acid esters and end mercapto compounds of epoxy resins; phenolic resins such as bisphenol A, bisphenol F, bisphenol AD, bisphenol S, tetramethyl bisphenol A, tetramethyl bisphenol F, tetramethyl bisphenol AD, tetramethyl bisphenol S, tetrabromo bisphenol A, tetrachloro bisphenol A, tetrafluoro bisphenol A, bisphenol, dihydroxynaphthalene, 1,1,1-tris(4-hydroxyphenyl)methane, 4,4-(1-(4-(1-(4-hydroxyphenyl)-1-methylethyl)phenyl)ethylidene)bisphenol, phenol novolac, cresol novolac, bisphenol A novolac, brominated phenol novolac, and brominated bisphenol A novolac; polyols obtained by hydrogenating the aromatic ring of these phenol resins; alicyclic acid anhydrides such as polyazelaic anhydride, methyltetrahydrophthalic anhydride, tetrahydrophthalic anhydride, methylhexahydrophthalic anhydride, hexahydrophthalic anhydride, 5-norbornene-2,3-dicarboxylic anhydride, norbornane-2,3-dicarboxylic anhydride, methyl-5-norbornene-2,3-dicarboxylic anhydride, methyl-norbornane-2,3-dicarboxylic anhydride, cyclohexane-1,2,3-tricarboxylic acid-1,2-anhydride, and cyclohexane-1,2,4-tricarboxylic acid-1,2-anhydride; alkyl substituted glutaric anhydrides such as 3-alkylglutaric anhydride having an optionally branched $C_{1-8}$ alkyl group including 3-methylglutaric anhydride, 2,3-dialkylglutaric anhydride having an optionally branched $C_{1-8}$ alkyl group including 2-ethyl-3-propylglutaric anhydride, and 2,4-dialkylglutaric anhydride having an optionally branched $C_{1-8}$ alkyl group including 2,4-diethylglutaric anhydride and 2,4-dimethylglutaric anhydride; aromatic acid anhydrides such as phthalic anhydride, trimellitic anhydride, and pyromellitic anhydride; imidazoles such as 2-methylimidazole, 2-ethyl-4-methylimidazole, and 2-phenylimidazole, and salts thereof; amine adducts obtained by the reaction of the aliphatic amines, the aromatic amines and/or the imidazoles with an epoxy resin; hydrazines such as adipic dihydrazide; tertiary amines such as dimethylbenzylamine and 1,8-diazabicyclo[5,4,0]undecene-7; organic phosphines such as triphenylphosphine; and dicyandiamide. These heat curing agents may be used alone, or two or more of these may be used in combination. When the bifunctional silicone resin containing, for example, the resin component represented by formula (12) or (13) is contained, the heat curing agent is capable of reacting with the glycidyl-containing group in the bifunctional silicone resin.

Among them, the acid anhydrides such as alicyclic acid anhydrides, alkyl substituted glutaric anhydrides, and aromatic acid anhydrides are preferable. The alicyclic acid anhydrides and alkyl substituted glutaric anhydrides are more preferable. Methylhexahydrophthalic anhydride, hexahydrophthalic anhydride, norbornane-2,3-dicarboxylic anhydride, methyl-norbornane-2,3-dicarboxylic anhydride, cyclohexane-1,2,3-tricarboxylic acid 1,2-anhydride, cyclohexane-1,2,4-tricarboxylic acid 1,2-anhydride, and 2,4-diethyl glutaric anhydride are particularly preferable.

The amount of the heat curing agent to be used is not particularly limited, but preferably has a lower limit of 1 part by weight and an upper limit of 200 parts by weight with respect to 100 parts by weight of the silicone resin (when the bifunctional silicone resin is contained, it refers to the total amount of the silicone resin and the bifunctional silicone resin). With the heat curing agent in an amount within this range, a crosslinking reaction of the sealing agent for an optical semiconductor device of the present invention adequately proceeds, and the sealing agent has excellent heat resistance and light resistance, and has adequately low moisture permeability. The more preferable lower limit is 5 parts by weight, and the more preferable upper limit is 120 parts by weight.

The sealing agent for an optical semiconductor device of the present invention contains a fine particulate material of silicon oxide.

Owing to the fine particulate material of silicon oxide, the sealing agent for an optical semiconductor device of the present invention has viscosity properties in the above-mentioned range without sacrificing the transparency, heat resistance and light resistance. Specifically, the viscosity properties can be adjusted in the above-mentioned range by appropriately adjusting the amount of the fine particulate material of silicone oxide to be used, considering, for example, the structure of the silicone resin, the specific surface area and the surface state of the fine particulate material of silicon oxide in the sealing agent for an optical semiconductor device of the present invention.

The primary particle size of the fine particulate material of silicon oxide preferably has a lower limit of 5 nm and an upper limit of 200 nm. If the fine particulate material of silicon oxide has a primary particle size of less than 5 nm, the fine particulate material of silicon oxide may have low dispersability, and a cured product of the sealing agent for an optical semiconductor device may have low transparency. If the particulate material of silicon oxide has a primary particle size of more than 200 nm, light dispersion may be caused by the fine particulate material of silicon oxide, which in turn may cause some problems, that is, the transparency of a cured product of the sealing agent for an optical semiconductor device may be low; the viscosity increasing effect at 25° C. may not be produced; and deterioration of the viscosity with increase in the temperature may be unavoidable. The more preferable lower limit of the primary particle size of the fine particulate material of silicon oxide is 8 nm, and the more preferable upper limit is 150 nm.

The primary particle size of the fine particulate material of silicon oxide used herein is defined as the average value of the diameter of the fine particles of silicon oxide when the fine particulate material of silicon oxide is spherical, and is defined as the average value of the major axis when the fine particulate material of silicon oxide is non-spherical.

The BET specific surface area of the fine particulate material of silicon oxide preferably has a lower limit of 30 $m^2/g$ and an upper limit of 400 $m^2/g$. If the fine particulate material of silicon oxide has a BET specific surface area of less than 30 $m^2/g$, the sealing material for an optical semiconductor device may have a viscosity and a thixotropic value at 25° C. out of the above-mentioned ranges, and deterioration of the viscosity with increase in the temperature may be unavoidable. In addition, a cured product of the sealing agent may have low transparency. If the fine particulate material of silicon oxide has a BET specific surface area of more than 400 $m^2/g$, the fine particulate material of silicon oxide may aggregate, which may lead to low dispersibility, and lower transparency of a cured product of the sealing agent.

The fine particulate material of silicon oxide is not particularly limited, and examples thereof include silicas produced by a dry method such as fumed silica and melted silica, and silicas produced by a wet method such as colloidal silica, sol gel silica, and precipitated silica. Among them, fumed silica, having less volatile components and capable of providing high transparency, is suitably used.

Examples of the fine particulate material of silicon oxide made of fumed silica include Aerosil 50 (specific surface area: 50 $m^2/g$), Aerosil 90 (specific surface area: 90 $m^2/g$), Aerosil 130 (specific surface area: 130 $m^2/g$), Aerosil 200 (specific surface area: 200 $m^2/g$), Aerosil 300 (specific surface area 300 $m^2/g$), and Aerosil 380 (specific surface area: 380 $m^2/g$) (all available from Nihon Aerosil Co., Ltd.).

The fine particulate material of silicon oxide is preferably surface-treated with an organic silicon compound. Such a surface treatment provides the fine particulate material of silicone oxide with excellent dispersability without sacrificing the transparency of a cured product of the sealing agent, and enables the sealing agent to more effectively avoid deterioration of the viscosity with increase in the temperature.

The organic silicon compound is not particularly limited, and examples thereof include silane compounds having an alkyl group, silicon compounds having a siloxane backbone such as dimethylsiloxane, silicon compounds having an amino group, silicon compounds having a (meth)acrylic group, and silicon compounds having an epoxy group. Among them, organic silicon compounds having a trimethylsilyl group and organic silicon compounds having a polydimethylsiloxane group are preferable.

The "(meth)acryl" used herein means acryl or methacryl.

A method for surface-treating the organic silicon compound having a trimethylsilyl group is not particularly limited, and, for example, hexamethyl disilazane, trimethyl silyl chloride, trimethylmethoxysilane or the like may be used for the surface treatment.

Examples of commercial products of the fine particulate material of silicon oxide having the surface treated with such an organic silicon compound having a trimethylsilyl group include RX200 (specific surface area: 140 $m^2/g$), and R8200 (specific surface area: 140 $m^2/g$) (all available from Nihon Aerosil Co., Ltd.).

A method for surface-treating the organic silicon compound having a polydimethylsiloxane group is not particularly limited, and, for example, a compound having a silanol group at the end of the polydimethylsiloxane group, cyclic siloxane or the like may be used for the surface treatment.

Examples of commercial products of the fine particulate material of silicon oxide having the surface treated with such an organic silicon compound having a polydimethylsiloxane group include RY200 (specific surface area: 120 $m^2/g$) (available from Nihon Aerosil Co., Ltd.).

A method for surface treating the fine particulate material of silicon oxide with the organic silicon compound is not particularly limited, and examples thereof include direct treatment methods such as a dry method in which the fine particulate material of silicon oxide is added to a mixer, which can stir a mixture therein at a high speed, such as Henschel mixer or V-type mixer, and then added under stirring with the organic silicon compound directly or in the form of an aqueous alcohol solution, a solution of organic solvent or an aqueous solution; a slurry method in which the organic silicon compound is added to the slurry of the fine particulate material of silicon oxide; and a spraying method in which the organic silicon compound is added by spraying after the step of drying the fine particulate material of silicon oxide. Other examples thereof include an integral blending method in which the organic silicon compound is directly added in mixing the fine particulate material of silicon oxide and a matrix resin such as a silicone resin described later when preparing the sealing agent for an optical semiconductor device of the present invention.

The amount of the fine particulate material of silicon oxide to be used preferably has a lower limit of 3 parts by weight and an upper limit of 40 parts by weight with respect to 100 parts by weight of the silicone resin (when the bifunctional silicone resin is contained, it refers to the total amount of the silicone resin and the bifunctional silicone resin). With less than 3 parts by weight of the fine particulate material of silicon oxide, it may be difficult to adjust the viscosity of the sealing agent for an optical semiconductor device of the present invention within the above-mentioned range. With the fine particulate material of silicon oxide in an amount of more than 40 parts by weight, it may be impossible to adjust the viscosity or thixotropic value of the sealing agent for an optical semiconductor device of the present invention within the above-mentioned ranges, and a cured product of the sealing agent may have low transparency. The more preferable lower limit of the amount of the fine particulate material of silicon oxide is 5 parts by weight, and the more preferable upper limit is 35 parts by weight.

The sealing agent for an optical semiconductor device of the present invention preferably contains a phosphor. Any phosphor can be used, provided that it absorbs light emitted from a light emitting device sealed with the sealing agent for an optical semiconductor device of the present invention, generates fluorescence, and eventually generates light of a desired color. At least one type of phosphor may be appropriately selected. Specifically, the phosphor is excited by light emitted from the light emitting device, and generates fluorescence. Light of a desired color can be generated by a suitable combination of the light emitted from the light emitting device and the fluorescence generated by the phosphor.

The combination of the light emitting device and the phosphor is not particularly limited. For example, a blue phosphor, a red phosphor, and a green phosphor are preferably used in combination in order to obtain white light using a UV-LED chip as a light emitting device. For example, a green phosphor and a red phosphor are preferably used in combination, or a yellow phosphor is preferably used in order to obtain white light using a blue LED chip as a light emitting device.

The blue phosphor is not particularly limited, provided that it absorbs ultraviolet rays and emits blue fluorescence, and examples thereof include $(Sr,Ca,Ba,Mg)_{10}(PO_4)_6C_{12}$:Eu, $(Ba,Sr)MgAl_{10}O_{17}$:Eu, and $(Sr,Ba)_3MgSi_2O_8$:Eu.

The red phosphor is not particularly limited, and examples thereof include $(Sr,Ca)S$:Eu, $(Ca,Sr)_2SI_5N_8$:Eu, $CaSiN_2$:Eu, $CaAlSiN_3$:Eu, $Y_2O_2S$:Eu, $La_2O_2S$:Eu, $LiW_2O_8$:(Eu,Sm), $(Sr,Ca,Bs,Mg)_{10}(PO_4)_8Cl_2$:(Eu,Mn), and $Ba_3MgSi_2O_8$:(Eu,Mn).

The green phosphor is not particularly limited, and examples thereof include $Y_3(Al,Ga)_5O_{12}$:Ce, $SrGa_2S_4$:Eu, $Ca_3Sc_2Si_3O_{12}$:Ce, SrSiON:Eu, ZnS:(Cu,Al), $BaMgAl_{10}O_{17}$(Eu,Mn), and $SrAl_2O_4$:Eu.

The yellow phosphor is not particularly limited, and examples thereof include $Y_3Al_5O_{12}$:Ce, $(Y,Gd)_3Al_5O_{12}$:Ce, $Tb_3Al_5O_{12}$:Ce, $CaGa_2S_4$:Eu, and $Sr_2SiO_4$:Eu.

Other examples of the phosphor include organic phosphors such as perylene compounds.

The phosphor is preferably in the form of nanoparticles. The nanoparticlized phosphor enables reduction in light dispersion.

The primary particle size of the phosphor preferably has a lower limit of 0.1 µm and an upper limit of 100 µm. If the phosphor has a primary particle size of less than 0.1 µm, the phosphor may have low dispersibility to the sealing agent. If the phosphor has a primary particle size of more than 100 µm, the amount of light that is emitted out of an optical semiconductor device (package) produced using the phosphor may be remarkably decreased.

The "primary particle size of the phosphor" used herein is defined as the average value of the diameter of the phosphor when the phosphor is spherical, and is defined as the average value of the major axis when the phosphor is non-spherical.

The amount of the phosphor to be used is not particularly limited, but preferably has a lower limit of 0.1 parts by weight and an upper limit of 40 parts by weight with respect to 100 parts by weight of the sealing resin composition. With less than 0.1 parts by weight of the phosphor, light of a desired color may not be produced. With more than 40 parts by weight of the phosphor, the amount of light that is emitted out of an optical semiconductor device (package) produced using the phosphor may be remarkably decreased.

The sealing agent for an optical semiconductor device of the present invention preferably contains a dispersant.

With the dispersant, the phosphor and the fine particulate material of silicon oxide have improved dispersibility, and the sealing agent for an optical semiconductor device has higher transparency.

Examples of the dispersant include polyalkylene oxide surfactants, poly(meth)acrylate surfactants, fluorochemical surfactants, and silicone surfactants.

The amount of the dispersant to be used preferably has a lower limit of 0.01 parts by weight and an upper limit of 5 parts by weight with respect to 100 parts by weight of the silicone resin (when the bifunctional silicone resin is contained, it refers to the total amount of the silicone resin and the bifunctional silicone resin). With less than 0.01 parts by weight of the dispersant, the advantageous effect owing to the use of the dispersant may be hardly produced. With more than 5 parts by weight of the dispersant, a cured product of the sealing agent for an optical semiconductor device of the present invention may have a hardness out of the abovementioned range. The more preferable lower limit of the amount of the dispersant to be used is 0.05 parts by weight, and the upper limit is 3 parts by weight.

The sealing agent for an optical semiconductor device of the present invention preferably contains a curing accelerator.

With the curing accelerator, the sealing agent for an optical semiconductor device of the present invention cures soon after initiation of heating, which effectively enables the sealing agent for an optical semiconductor device of the present invention to avoid sedimentation of the phosphor.

The curing accelerator is not particularly limited, and example thereof include imidazoles; tertiary amines and salts thereof; phosphines; phosphonium salts; aminotriazoles; and metal catalysts.

The imidazoles are not particularly limited, and examples thereof include 2-methylimidazole, and 2-ethyl-4-methylimidazole.

Examples of the tertiary amines include 1,8-diazabicyclo (5,4,0)undecene-7.

Examples of the phosphines include triphenylphosphine.

Examples of the phosphonium salts include triphenylphosphonium bromide.

Examples of the metal catalysts include tin metal catalysts such as tin octylate and dibutyltin dilaurate; zinc metal catalysts such as zinc octylate; and acetylacetonatos of aluminum, chromium, cobalt, and zirconium.

These curing accelerators may be used alone, or two or more of these may be used in combination.

Among these, counter ion type curing accelerators containing a cation such as an ammonium salt or phosphonium salt, and an anion are preferable as they have excellent heat resistance and provides a faster curing rate.

A curing accelerator having a structure represented by formula (14) is also suitably used as the curing accelerator. With a curing accelerator of a borate salt having such a specific structure, the sealing agent for an optical semiconductor device of the present invention cures into a cured product having excellent transparency and light resistance as well as remarkably excellent heat resistance. The cured product hardly turns yellow under use-conditions when used as a sealing agent for an optical semiconductor device such as an LED. This may be explained as follows.

If a conventional curing accelerator containing a halogen such as Br⁻ as an anion is used as a curing accelerator for an epoxy sealing agent, the anion might react with the cyclic ether-containing group in a silicone resin having a cyclic ether-containing group so that only a counter-cation might remain unreacted. The counter-cation might react to yield a yellowing substance that causes deterioration of heat resistance. On the contrary, the curing accelerator having the structure represented by formula (14) is comparatively less reactive with the cyclic ether-containing group in the silicone resin owing to the bulky structure of formula $[BR^{44}R^{45}R^{46}R^{47}]^-$ of the anion (hereinafter, simply referred to as a borate salt), and thereby expected to decrease the amount of such a yellowing substance to be produced.

$$X^+[BR^{44}R^{45}R^{46}R^{47}]^- \qquad (14)$$

In formula (14), $R^{44}$ to $R^{47}$ individually represent a fluoro group, a substituted or unsubstituted alkyl group, a substituted or unsubstituted alkenyl group, a substituted or unsubstituted aralkyl group, a substituted or unsubstituted aryl group, or a substituted or unsubstituted alicyclic group. These may be the same as or different from one another. $X^+$ represents a cation having N, S, or P as a central atom.

The substituted or unsubstituted alkyl group is preferably a substituted or unsubstituted, linear or branched $C_{1-20}$ alkyl group, and examples thereof include methyl group, ethyl group, n-propyl group, isopropyl group, n-butyl group, isobutyl group, sec-butyl group, pentyl group, hexyl group, heptyl group, octyl group, 3-methoxypropyl group, 4-chlorobutyl group, and 2-diethylaminoethyl group.

The substituted or unsubstituted alkenyl group is preferably a substituted or unsubstituted, linear or branched $C_{2-12}$ alkenyl group, and examples thereof include vinyl group, propenyl group, butenyl group, pentenyl group, hexenyl group, heptenyl group, octenyl group, dodecynyl group, and prenyl group.

Examples of the substituted or unsubstituted aryl group include phenyl group, tolyl group, xylyl group, 4-ethylphenyl group, 4-butylphenyl group, 4-tert-butylphenyl group, 4-methoxyphenyl group, 4-diethylaminophenyl group, 2-methylphenyl group, 2-methoxyphenyl group, naphthyl group, and 4-methylnaphthyl group.

Examples of the substituted or unsubstituted aralkyl group include benzyl group, phenethyl group, propiophenyl group, α-naphthylmethyl group, β-naphthylmethyl group, and p-methoxybenzyl group.

Examples of the substituted or unsubstituted alicyclic group include cyclohexyl group, 4-methylcyclohexyl group, cyclopentyl group, and cycloheptyl group.

The borate salt is not particularly limited, and examples thereof include tetrafluoroborate, tetraphenylborate, tetraethylborate, tetrabutylborate, tetrakis(4-methylphenyl)borate, tetrakis(4-tert-butylphenyl)borate, tetrakis(4-fluorophenyl)borate, tetrakis(4-methoxyphenyl)borate, tetrakis(2,3,4,5,6-pentafluorophenyl)borate, tetrakis[3,5-bis(trifluoromethyl)phenyl]borate, n-butyltriphenylborate, n-butyltris-4-tert-butylphenylborate, and n-butyl trinaphthylborate.

Among these, borate salts in which three of $R^{44}$ to $R^{47}$ are the substituted or unsubstituted aryl groups, and the other one is the substituted or unsubstituted alkyl group are preferable. This is because the alkyl group is expelled as a radical, and is expected to trap the radical species which may produce a yellowing substance.

Examples of the borate salt include, specifically, n-butyltriphenylborate, n-butyltris-4-tert-buthylphenylborate, and n-butyltrinaphthylborate.

In formula (14), $X^+$ represents a cation having N, S, or P as a central atom. Examples of the cation include ammonium cations, phosphonium cations, sulfonium cations, imidazolium cations, pyridinium cations, pyrrolidinium cations, piperidinium cations, the quaternary nitrogen cation in 1,5-diazabicyclo[4,3,0]nonene-5, the quaternary nitrogen cation in 6-dibutylamino-1,8-diazabicyclo[5,4,0]undecene-7, and the quaternary nitrogen cation in 6-(2-hydroxypropyl)-1,8-diazabicyclo[5,4,0]undecene-7.

Examples of the ammonium cations include tetramethylammonium cation, tetraethylammonium cation, tetra-n-propylammonium cation, tetra-n-butylammonium cation, tetra-n-pentylammonium cation, tetra-n-octylammonium cation, tetra-n-dodecylammonium cation, tetra-n-tetradecylammonium cation, tetra-n-octadecylammonium cation, tetrakis-2-hydroxyethylammonium cation, tetrakis-3-hydroxypropylammonium cation, tetrakis-2-cyanoethylammonium cation, triethyloctylammonium cation, tri-n-butylmethylammonium cation, tri-n-butyloctylammonium cation, tri-n-butyldodecylammonium cation, tri-n-hexadecylammonium cation, tri-2-hydroxyethyloctylammonium cation, tri-2-hydroxyethyldodecylammonium cation, tri-2-hydroxyethylhexadecyldecylammonium cation, tri-3-hydroxyethyloctylammonium cation, tri-3-hydroxyethyldodecylammonium cation, tri-3-hydroxyethylhexadecyldecylammonium cation, tri-2-cyanoethyloctylammonium cation, tri-2-cyanoethyldodecylammonium cation, tri-2-cyanoethylhexadecyldecylammonium cation, allyltriethylammonium cation, allyltri-n-propylammonium cation, allyltri-n-butylammonium cation, allyltri-n-octylammonium cation, trimethyl[3-(triethoxysilyl)propyl]ammonium cation, cyclohexyltrimethylammonium cation, tetraphenylammonium cation, benzyltrimethylammonium cation, benzyltriethylammonium cation, benzyltri-n-butylammonium cation, 3-(trifluoromethyl)phenyltrimethylammonium cation, phenyltrimethylammonium cation, and benzyltriphenylammonium cation.

Examples of the phosphonium cations include tetramethylphosphonium cation, tetraethylphosphonium cation, tetra-n-propylphosphonium cation, tetra-n-butyl phosphonium cation, tetra-n-pentylphosphonium cation, tetra-n-octylphosphonium cation, tetra-n-dodecylphosphonium cation, tetra-n-tetradecylphosphonium cation, tetra-n-octadecylphosphonium cation, tetrakis-2-hydroxyethylphosphonium cation, tetrakis-3-hydroxypropylphosphonium cation, tetrakis-2-cyanoethylphosphonium cation, triethyloctylphosphonium cation, tri-n-butylmethylphosphonium cation, tri-n-butyloctylphosphonium cation, tri-n-butyldodecylphosphonium cation, tri-n-hexadecylphosphonium cation, tri-2-hydroxyethyloctylphosphonium cation, tri-2-hydroxyethyldodecylphosphonium cation, tri-2-hydroxyethylhexadecylphosphonium cation, tri-3-hydroxyethyloctylphosphonium cation, tri-3-hydroxyethyldodecylphosphonium cation, tri-3-hydroxyethylhexadecylphosphonium cation, tri-2-cyanoethyloctylphosphonium cation, tri-2-cyanoethyldodecylphosphonium cation, tri-2-cyanoethylhexadecylphosphonium cation, allyltriethylphosphonium cation, allyltri-n-propylphosphonium cation, allyltri-n-butylphosphonium cation, allyltri-n-octylphosphonium cation, tetra-phenylphosphonium cation, benzyltrimethylphosphonium cation, benzyltriethylphosphonium cation, benzyltri-n-butylphosphonium cation, 3-(trifluoromethyl)phenyltrimethylphosphonium cation, phenyltrimethylphosphonium cation, and benzyltriphenylphosphonium cation.

Examples of the sulfonium cations include triphenylsulfonium cation, trimethylsulfonium cation, and dimethylphenylsulfonium cation. Examples of the imidazolium cations include 1,3-dimethylimidazolium cation, 1-ethyl-3-methylimidazolium cation, 1-propyl-3-methylimidazolium cation, 1-butyl-3-methylimidazolium cation, 1-ethyl-3-hexylimidazolium cation, 1-octyl-3-methylimidazolium cation, 1-decyl-3-methylimidazolium cation, 1-dodecyl-3-methylimidazolium cation, 1-hexadecyl-3-methylimidazolium cation, 1-dodecyl-3-methylimidazolium cation, 1-vinyl-3-methylimidazolium cation, 1-ethyl-2,3-dimethylimidazolium cation, 1-propyl-2,3-dimethylimidazolium cation, 1-butyl-2,3-dimethylimidazolium cation, 1-hexyl-2,3-dimethylimidazolium cation, 1-methyl-3-(3,3,4,4,5,5,6,6,7,7,8,8,8-tridecafluorooctyl)imidazolium cation, 1-butyl-3-(3,3,4,4,5,5,6,6,7,7,8,8,8-tridecafluorooctyl)imidazolium cation, 1-methyl-3-allylimidazolium cation, 1-ethyl-3-allylimidazolium cation, 1-propyl-3-allylimidazolium cation, 1-butyl-3-allylimidazolium cation, 1-pentyl-3-allylimidazolium cation, 1-methyl-3-allylimidazolium cation, 1-hexylpyridinium cation, 1-heptyl-3-allylimidazolium cation, 1-octyl-3-allylimidazolium cation, and 1-allyl-3-allylimidazolium cation.

Examples of the pyridinium cations include 1-butylpyridinium cation, 1-hexylpyridinium cation, 1-butyl-4-methylpyridinium cation, 1-ethyl-3-methylpyridinium cation, 1-ethyl-3-(hydroxymethyl)pyridinium cation, 1-propyl-3-methylpyridinium cation, and 1-butyl-3-methylpyridinium cation.

Examples of the pyrrolidinium cations include 1-butyl-1-methylpyrrolidinium cation.

Examples of the piperidinium cations include 1-methyl-1-propylpiperidinium cation.

In particular, $X^+$ in formula (14) preferably has the cation structure represented by formula (15).

Use of a curing accelerator having such a cation structure further improves the heat resistance of the sealing agent for an optical semiconductor device of the present invention. This may be explained as follows. Even if the cation is heat discomposed during a curing process, the resulting product such as amine or phosphine is a comparatively weak base. Therefore, it is possible to suppress generation of a substance that causes coloration in the curing reaction.

$$Y^+(R^{48})_n \qquad (15)$$

In formula (15), $Y^+$ represents N, S, or P, and n represents 3 or 4. A plurality of $R^{48}$s individually represent a substituted or unsubstituted alkyl group, a substituted or unsubstituted alkenyl group, a substituted or unsubstituted aralkyl group, a substituted or unsubstituted aryl group, a substituted or unsubstituted heterocyclic group, a substituted or unsubstituted alicyclic group, or a substituted or unsubstituted silyl group. These may be the same as or different from one another.

The substituted or unsubstituted alkyl group is preferably a substituted or unsubstituted, linear or branched $C_{1-20}$ alkyl group, and examples thereof include methyl group, ethyl group, n-propyl group, isopropyl group, n-butyl group, isobutyl group, sec-butyl group, pentyl group, hexyl group, heptyl group, octyl group, 3-methoxypropyl group, 4-chlorobutyl group, and 2-diethylaminoethyl group.

The substituted or unsubstituted alkenyl group is preferably a substituted or unsubstituted, linear or branched $C_{2-12}$ alkenyl group, and examples thereof include vinyl group, propenyl group, butenyl group, pentenyl group, hexenyl group, heptenyl group, octenyl group, dodecynyl group, and prenyl group.

Examples of the substituted or unsubstituted aryl group include phenyl group, tolyl group, xylyl group, 4-ethyl phenyl group, 4-buthylphenyl group, 4-tert-buthylphenyl group, 4-methoxyphenyl group, 4-diethylaminophenyl group, 2-methylphenyl group, 2-methoxyphenyl group, naphthyl group, and 4-methylnaphthyl group.

Examples of the substituted or unsubstituted aralkyl group include benzyl group, phenethyl group, propiophenyl group, α-naphthylmethyl group, β-naphthylmethyl group, and p-methoxybenzyl group.

Examples of the substituted or unsubstituted heterocyclic group include pyridyl group, quinolyl group, methylpyridyl group, and indolyl group.

Examples of the substituted or unsubstituted alicyclic group include cyclohexyl group, 4-methylcyclohexyl group, cyclopentyl group, and cycloheptyl group.

Examples of the substituted or unsubstituted heterocyclic group include 3-(triethoxysilyl)propyl group.

The cation structure represented by formula (15) is not particularly limited, and examples thereof include ammonium cation, phosphonium cation, and sulfonium cation.

Examples of the ammonium cations include tetramethylammonium cation, tetraethylammonium cation, tetra-n-propylammonium cation, tetra-n-butylammonium cation, tetra-n-pentylammonium cation, tetra-n-octylammonium cation, tetra-n-dodecylammonium cation, tetra-n-tetradecylammonium cation, tetra-n-octadecylammonium cation, tetrakis-2-hydroxyethylammonium cation, tetrakis-3-hydroxypropylammonium cation, tetrakis-2-cyanoethylammonium cation, triethyloctylammonium cation, tri-n-butylmethylammonium cation, tri-n-butyloctylammonium cation, tri-n-butyldodecylammonium cation, tri-n-hexadecylammonium cation, tri-2-hydroxyethyloctylammonium cation, tri-2-hydroxyethyldodecylammonium cation, tri-2-hydroxyethylhexadecyldecylammonium cation, tri-3-hydroxyethyloctylammonium cation, tri-3-hydroxyethyldodecylammonium cation, tri-3-hydroxyethylhexadecyldecylammonium cation, tri-2-cyanoethyloctylammonium cation, tri-2-cyanoethyldodecylammonium cation, tri-2-cyanoethylhexadecyldecylammonium cation, allyltriethylammonium cation, allyltri-n-propylammonium cation, allyltri-n-butylammonium cation, allyltri-n-octylammonium cation, trimethyl[3-(triethoxysilyl)propyl]ammonium cation, cyclohexyltrimethylammonium cation, tetraphenylammonium cation, benzyltrimethylammonium cation, benzyltriethylammonium cation, benzyltri-n-butylammonium cation, 3-(trifluoromethyl)phenyltrimethylammonium cation, phenyltrimethylammonium cation, and benzyltriphenylammonium cation.

Examples of the phosphonium cations include tetramethylphosphonium cation, tetraethylphosphonium cation, tetra-n-propylphosphonium cation, tetra-n-butyl phosphonium cation, tetra-n-pentylphosphonium cation, tetra-n-octylphosphonium cation, tetra-n-dodecylphosphonium cation, tetra-n-tetradecylphosphonium cation, tetra-n-octadecylphosphonium cation, tetrakis-2-hydroxyethylphosphonium cation, tetrakis-3-hydroxypropylphosphonium cation, tetrakis-2-cyanoethylphosphonium cation, triethyloctylphosphonium cation, tri-n-butylmethylphosphonium cation, tri-n-butyloctylphosphonium cation, tri-n-butyldodecylphosphonium cation, tri-n-hexadecylphosphonium cation, tri-2-hydroxyethyloctylphosphonium cation, tri-2-hydroxyethyldodecylphosphonium cation, tri-2-hydroxyethylhexadecylphosphonium cation, tri-3-hydroxyethyloctylphosphonium cation, tri-3-hydroxyethyldodecylphosphonium cation, tri-3-hydroxyethylhexadecylphosphonium cation, tri-2-cyanoethyloctylphosphonium cation, tri-2-cyanoethyldodecylphosphonium cation, tri-2-cyanoethylhexadecylphosphonium cation, allyltriethylphosphonium cation, allyltri-n-propylphosphonium cation, allyltri-n-butylphosphonium cation, allyltri-n-octylphosphonium cation, tetra-phenylphosphonium cation, benzyltrimethylphosphonium cation, benzyltriethylphosphonium cation, benzyltri-n-butylphosphonium cation, 3-(trifluoromethyl)phenyltrimethylphosphonium cation, phenyltrimethylphosphonium cation, and benzyltriphenylphosphonium cation.

Examples of the sulfonium cations include triphenylsulfonium cation, trimethylsulfonium cation, and dimethylphenylsulfonium cation.

Examples of the particularly preferable combination of the above-mentioned borate salt and the cation in the curing accelerator having the structure represented by formula (14) include (tetraethylammonium, n-butyltriphenylborate), (tetraethylammonium, n-butyltris-4-tert-butylphenylborate), (tetraethylammonium, n-butyltrisnaphthylborate), (tetra-n-butylammonium, n-butyltriphenylborate), (tetra-n-butylammonium, n-butyltris-4-tert-butylphenylborate), (tetra-n-butylammonium, n-butyltrisnaphthylborate), (tetraethylphosphonium, n-butyltriphenylborate), (tetraethylphosphonium, n-butyltris-4-tert-butylphenylborate), (tetraethylphosphonium, n-butyltrisnaphthylborate), (tetra-n-butylphosphonium, n-butyltriphenylborate), (tetra-n-butylphosphonium, n-butyltris-4-tert-butylphenylborate), and (tetra-n-butylphosphonium, n-butyltrisnaphthylborate).

The amount of the curing accelerator to be used is not particularly limited, but preferably has a lower limit of 0.01 parts by weight and an upper limit of 5 parts by weight with respect to 100 parts by weight of the silicone resin (when the bifunctional silicone resin is contained, it refers to the total amount of the silicone resin and the bifunctional silicone resin). With less than 0.01 parts by weight of the curing accelerator, the advantageous effect owing to the use of the curing accelerator may be hardly produced. With more than 5 parts by weight of the curing accelerator, a cured product of the sealing agent for an optical semiconductor device of the present invention may unfavorably be colored, and have a remarkably low heat resistance and light resistance. The more preferable lower limit of the amount of the curing accelerator to be used is 0.05 parts by weight, and the more preferable upper limit is 1.5 parts by weight.

The sealing agent for an optical semiconductor device of the present invention preferably contains an antioxidant.

Suitable examples of the antioxidant include sulfur antioxidants, hindered amine antioxidants, phosphorus antioxidants, and phenolic antioxidants. Among these, phosphorus compounds having at least one backbone selected from the group consisting of phosphite backbone, phosphonite backbone, phosphate backbone, and phosphinate backbone (hereinafter, simply referred to as phosphorus compounds), phenolic compounds which are substituted phenol derivatives having an alkyl group at least at the second position (hereinafter, simply referred to as phenolic compounds) are preferable.

With the phosphorus compounds or the phenolic compounds as the antioxidant, the sealing agent for an optical semiconductor device of the present invention cures into a cured product that does not turn yellow under use environment and has excellent heat resistance.

The phosphorus compounds are not particularly limited, and examples thereof include ADEKA STAB PEP-4C, ADEKA STAB PEP-8, ADEKA STAB PEP-24G, ADEKA STAB PEP-36, ADEKA STAB HP-10, ADEKA STAB 2112, ADEKA STAB 260, ADEKA STAB 522A, ADEKA STAB 1178, ADEKA STAB 1500, ADEKA STAB C, ADEKA STAB 135A, ADEKA STAB 3010, and ADEKA STAB TPP (all available from Adeka Corporation); Sandostab P-EPQ and Hostanox PAR24 (all available from Clariant, LTD.); JP-312L, JP-318-0, JPM-308, JPM-313, JPP-613M, JPP-31, JPP-2000PT, and JPH-3800 (all available from Johoku Chemical Co., Ltd.).

The amount of the phosphorus compound to be used is not particularly limited, but has a preferable lower limit of 0.01 parts by weight and a preferable upper limit of 2.0 parts by weight with respect to 100 parts by weight of the silicone resin (when the bifunctional silicone resin is contained, it refers to the total amount of the silicone resin and the bifunctional silicone resin). With less than 0.01 parts by weight of the phosphorus compound, the advantageous effect resulting from the use of the phosphorus compound may not be produced. With more than 2.0 parts by weight of the phosphorus compound, the light resistance of the sealing agent may be disadvantageously very low. The more preferable lower limit of the amount of the phosphorus compound to be used is 0.05 parts by weight, and the more preferable upper limit thereof is 1.0 part by weight. In the sealing agent for an optical semiconductor device of the present invention, the above-mentioned phosphorus compounds may be used alone, or two or more of these may be used in combination.

The phenolic compound is preferably a substituted phenol derivative having an alkyl group at least at the second position. Phenolic compounds without an alkyl group at the second position may not function to stabilize radicals generated under high-temperature environment.

It should be noted that, in the description, the location numbers for substituents such as the alkyl group in the substituted phenol derivative are assigned from the first, second, third, fourth, fifth, and sixth for the carbons starting from the carbon linked to the OH group in the clockwise order or the counterclockwise order. Therefore, this assignment is not necessarily in accordance with the IUPAC nomenclature.

The phenolic compound is preferably a substituted phenol derivative that does not have an alkyl group at the sixth position. With such a substituted phenol derivative, it is possible to further improve the heat resistance of the sealing agent for an optical semiconductor device of the present invention. This may be explained as follows. The substituted phenol derivative that does not have an alkyl group at the sixth position has a structure in which an alkyl group is located at either one of the ortho positions of the OH group. This structure is free from steric hindrance around the OH group, and thereby the oxygen atom adjacent to the phosphorus atom in the phosphorus compound and the OH group in the phenolic compound are likely to form a hydrogen bond. As a result, the interaction between the phosphorus compound and the phenolic compound is enhanced, which in turn enhances the performance to stabilize or decompose the above-mentioned yellowing substance.

The substituted phenol derivative does not have an alkyl group at the sixth position is not particularly limited, and examples thereof include 2-tert-butyl-4-methyl phenol, 2,4-di-tert-butylphenol, 2,4-di-tert-pentylphenol, 4,4'-thiobis(3-methyl-6-tert-butylphenol), 4,4'-butylidenebis-(3-methyl-6-tert-butylphenol), and bis-[3,3-bis-(4'-hydroxy-3'-tert-butylphenyl)-butanic acid]-glycol ester.

The phenolic compound preferably has a quaternary carbon-containing group at the fourth position. With the phenolic compound, it is possible to further improve the heat resistance of the sealing agent for an optical semiconductor device of the present invention. This may be explained as follows. The phenolic compounds having a quaternary carbon-containing group at the fourth position can prevent formation of a yellowing substance having a quinone backbone although phenolic compounds without a quaternary carbon-containing group at the fourth position produces the yellowing substance resulting from an intramolecular reaction or intermolecular reaction when used under severe conditions, and may cause yellow discoloration.

The phenolic compound having a quaternary carbon-containing group at the fourth position is not particularly limited, and examples thereof include 2,4-di-tert-butylphenol, 2,4-di-tert-pentylphenol, 2-[1-(2-hydroxy-3,5-di-tert-pentylphenyl)ethyl]-4,6-di-tert-pentylphenyl acrylate, and bis-[3,3-bis-(4'-hydroxy-3'-tert-butylphenyl)-butanoic acid]-glycol ester.

In particular, bis-[3,3-bis-(4'-hydroxy-3'-tert-butylphenyl)-butanoic acid]-glycol ester, and 2-[1-(2-hydroxy-3,5-di-tert-pentylphenyl)ethyl]-4,6-di-tert-pentylphenyl acrylate are preferable among the above-mentioned phenolic compounds.

Commercial products may be used as the phenolic compound. Any commercially available phenolic compound may be used, and examples thereof include IRGANOX 1010, IRGANOX 1035, IRGANOX 1076, IRGANOX 1135, IRGANOX 245, IRGANOX 259, and IRGANOX 295 (all available from Ciba Specialty Chemicals); ADEKA STAB AO-30, ADEKA STAB AO-40, ADEKA STAB AO-50, ADEKA STAB AO-60, ADEKA STAB AO-70, ADEKA STAB AO-80, ADEKA STAB AO-90, and ADEKA STAB AO-330 (all available from ADEKA Corporation); Sumilizer GA-80, Sumilizer MDP-S, Sumilizer BBM-S, Sumilizer GM, Sumilizer GS(F), and Sumilizer GP (all available from Sumitomo Chemical Co., Ltd.); HOSTANOX O10, HOSTANOX O16, HOSTANOX O14, and HOSTANOX O3 (all available from Clariant); Antage BHT, Antage W-300, Antage W-400, and Antage W-500 (all available from Kawaguchi Chemical Industry Co., Ltd.); and SEENOX 224M, and SEENOX 326M (all available from SHIPRO KASEI KAISHA, LTD.).

The amount of the phenolic compound to be used is not particularly limited, but preferably has a lower limit of 0.01 parts by weight and an upper limit of 2.0 parts by weight with respect to 100 parts by weight of the silicone resin (when the bifunctional silicone resin is contained, it refers to the total amount of the silicone resin and the bifunctional silicone resin). With less than 0.01 parts by weight of the phenolic compound, the advantageous effect resulting from the use of the phenolic compound may not be produced. With more than 2.0 parts by weight of the phenolic compound, the light resistance of the sealing agent may be unfavorably very low. The more preferable lower limit of the amount of the phenolic compound to be used is 0.05 parts by weight, and the more preferable upper limit thereof is 1.0 part by weight. In the sealing agent for an optical semiconductor device of the present invention, the above-mentioned phenolic compounds may be used alone, or two or more of these may be used in combination.

When the sealing agent for an optical semiconductor device of the present invention contains the phosphorus compound and the phenolic compound, the blending ratio of the phosphorus compound and the phenolic compound is not particularly limited. However, the ratio of "the phosphorus compound/phenolic compound" (weight ratio) preferably has a lower limit of 0.1 and an upper limit of 20. At the ratio of "the phosphorus compound/phenolic compound" (weight ratio) of less than 0.1, the advantageous effect resulting from the use of the phosphorus compound may not be produced. At the ratio of more than 20, the advantageous effect resulting from the use of the phenolic compound may not be produced. The more preferable lower limit of the ratio of "the phosphorus compound/phenolic compound" (weight ratio) is 0.5, and the more preferable upper limit is 10.

The sealing agent for an optical semiconductor device of the present invention may contain a coupling agent in order to improve the adhesiveness.

The coupling agent is not particularly limited, and examples thereof include silane coupling agents such as vinyltriethoxysilane, vinyltrimethoxysilane, 3-glycidoxypropyltrimethoxysilane, γ-methacryloxypropyltrimethoxysilane, γ-aminopropyltrimethoxysilane, and N-phenyl-3-aminopropyltrimethoxysilane. These coupling agents may be used alone, or two or more of these may be used in combination.

The amount of the coupling agent to be used preferably has a lower limit of 0.1 parts by weight and an upper limit of 5 parts by weight with respect to 100 parts by weight of the silicone resin (when the bifunctional silicone resin is contained, it refers to the total amount of the silicone resin and the bifunctional silicone resin). With less than 0.1 parts by weight of the coupling agent, the advantageous effect resulting from the use of the coupling agent may not be produced. With more than 5 parts by weight of the coupling agent, unreacted coupling agent may volatilize, which may cause problems such as decrease in the thickness of a cured product of the sealing agent for an optical semiconductor device of the present invention.

The sealing agent for an optical semiconductor device of the present invention may optionally contain additives such as antifoaming agents, coloring agents, modifiers, leveling agents, light diffusion agents, thermally conductive fillers, and fire retardants.

The curing temperature of the sealing agent for an optical semiconductor device of the present invention is not particularly limited, but is preferably in the range of 80° C. to 180° C. If the sealing agent for an optical semiconductor device of the present invention has a curing temperature of lower than 80° C., the sealing agent may not cure. If the sealing agent for an optical semiconductor device of the present invention has a curing temperature of higher than 180° C., the sealing agent may disadvantageously cause heat deterioration of a package. The curing temperature is more preferably in the range of 100° C. to 150° C.

The sealing agent may be cured by any process, and preferable examples include a step curing process. The step curing process includes the steps of semi-curing at low temperature, and curing at high temperature, and can preferably prevent cure shrinkage of the sealing agent.

The decrease ratio of the light transmittance of a cured product of the sealing material for an optical semiconductor device of the present invention before and after a light resistance test is preferably less than 10%. If the decrease ratio of the light transmittance of the cured product before and after the light resistance test is 10% or higher, the optical property of an optical semiconductor device formed by using the sealing agent for an optical semiconductor device of the present invention may be insufficient.

The light resistance test is a test in which a cured product with a thickness of 2 mm obtained by curing the sealing agent for an optical semiconductor device of the present invention is irradiated at 100 mW/cm$^2$ for 24 hours using a high-pressure mercury vapor lamp to which a filter for cutting light with a wavelength of 340 nm or less is attached, and the light transmittance after the light resistance test is a light transmittance of the above-mentioned cured product at a wavelength of 400 nm measured with "U-4000" produced by Hitachi, Ltd. after the light resistance test.

The decreasing ratio of the light transmittance of a cured product of the sealing material for an optical semiconductor device of the present invention before and after a heat resistance test is preferably less than 10%. If the decreasing ratio of the light transmittance of the cured product before and after the heat resistance test is 10% or higher, the optical property of an optical semiconductor device formed by using the sealing agent for an optical semiconductor device of the present invention may be insufficient.

The heat resistance test is a test in which a cured product with a thickness of 2 mm obtained by curing the sealing agent for an optical semiconductor device of the present invention is left in an oven at 150° C. for 500 hours, and the light transmittance after the heat resistance test is a transmittance of the above-mentioned cured product at a wavelength of 400 nm measured with "U-4000" produced by Hitachi, Ltd. after the heat resistance test.

A method for producing the sealing agent for an optical semiconductor device of the present invention is not particularly limited, and examples of the method include a method in which predetermined amounts of the silicone resin, the heat curing agent, and the fine particulate material of silicon oxide, and optionally the curing accelerator and the antioxidant are mixed at normal temperature or under heating using a mixer such as a homodisper, a homomixer, a universal mixer, a planetary mixer, a kneader, a three roll, or a bead mill.

An optical semiconductor device can be produced by sealing a light emitting device using the sealing agent for an optical semiconductor device of the present invention. The optical semiconductor device formed by using the sealing agent for an optical semiconductor device of the present invention is also one aspect of the present invention.

The light emitting device is not particularly limited. For example, a light emitting device having a semiconductor material laminated on a substrate may be used when the above-mentioned optical semiconductor device is a light emitting diode. In this case, examples of the semiconductor material include GaAs, GaP, GaAlAs, GaAsP, AlGaInP, GaN, InN, AlN, InGaAlN, and SiC.

Examples of the substrate include sapphire, spinel, SiC, Si, ZnO, and GaN single crystals. A buffer layer may be optionally formed between the substrate and the semiconductor material. Examples of the buffer layer include GaN, and AlN buffer layers.

A method for laminating semiconductor materials on the substrate is not particularly limited, and examples of the method include an MOCVD method, an HDVPE method, and a liquid phase growth method.

Examples of the structure of the light emitting device include a homojunction having a MIS junction, a PN junction, or a PIN junction, a heterojunction, and a double heterostructure. Alternatively, a single quantum well structure or a multiple quantum well structure may be employed.

When the light emitting device is sealed with the sealing agent for an optical semiconductor device of the present invention, a second sealing agent may be used in combination as long as the effect of the present invention is not adversely affected. In this case, after the light emitting device is sealed with the sealing agent for an optical semiconductor device of the present invention, the periphery of the sealed portion may be sealed with the second sealing agent. Alternatively, after the light emitting device is sealed with the second sealing agent, the periphery of the sealed portion may be sealed with the sealing agent for an optical semiconductor device of the present invention.

The second sealing agent is not particularly limited, and examples thereof include epoxy resins, silicone resins, acrylic resins, urea resins, imide resins, and glasses. A liquid containing a surface modifier may be applied to the surface to provide a protective layer.

A method for sealing the light emitting device with the sealing agent for an optical semiconductor device of the present invention is not particularly limited, and example thereof include a method including the steps of: charging the sealing agent for an optical semiconductor device of the present invention into a mold; immersing a lead frame and the like with the light emitting device fixed thereon to the mold; and curing the sealing agent, and a method including the steps of: charging the sealing agent for an optical semiconductor device of the present invention into a mold in which the light emitting device is previously placed; and curing the sealing agent.

The sealing agent for an optical semiconductor device of the present invention may be charged by, for example, using a dispenser, transfer molding, and injection molding. Other examples of the sealing method include: a method including the steps of applying the sealing agent for an optical semiconductor device of the present invention to the light emitting device dropwise or by stencil printing, screen printing, or through a mask, and curing the sealing agent; and a method including the steps of charging the sealing agent for an optical semiconductor device of the present invention, for example, with a dispenser into a cup and the like in which the light emitting device is disposed on the bottom, and curing the sealing agent.

Whichever method among these is employed, the sealing agent for an optical semiconductor device of the present invention is capable of significantly stably maintaining its shape when used to seal the light emitting device, owing to the viscosity within the above-mentioned range.

FIGS. 1 and 2 are cross-sectional views schematically illustrating one example of an optical semiconductor device obtained by using the sealing agent for an optical semiconductor device and a die bond material for an optical semiconductor device (i.e. an optical semiconductor device of the present invention), and FIG. 3 is a cross-sectional view schematically illustrating one example of an optical semiconductor device obtained by using the sealing agent for an optical semiconductor device of the present invention and an underfill material for an optical semiconductor device (i.e. an optical semiconductor device of the present invention).

In the optical semiconductor device shown in FIG. 1, a light emitting device 11 is provided on a heat sink 16 through a die bond material 10 for an optical semiconductor device, and the light emitting device 11 is electrically connected to two lead electrodes 14 extending along the side face from the top face to the bottom face of a housing material via a gold wire 13. The light emitting device 11, the die bond material 10 for an optical semiconductor device and the gold wire 13 are sealed with the sealing agent 12 for an optical semiconductor device of the present invention.

FIG. 2 shows an optical semiconductor device in which a die bond material for an optical semiconductor device has high electric conductivity owing to a particle therein including at least one selected from the group consisting of gold, silver and copper.

In the optical semiconductor device shown in FIG. 2, a light emitting device 21 is provided thorough a die bond material 20 for an optical semiconductor device, and one end of one of two lead electrodes 24 extending along the side face from the top face to the bottom face of a housing material 25 is disposed between the die bond material 20 for an optical semiconductor device and the housing material 25, and is electrically connected to the light emitting device 21 through the die bond material 20 for an optical semiconductor device. The other lead electrode 24 is electrically connected to the light emitting device 21 via a gold wire 23. The light emitting device 21, the die bond material 20 for an optical semiconductor device and the gold wire 23 are sealed with the sealing agent 22 for an optical semiconductor device of the present invention.

In the optical semiconductor device shown in FIG. 3, a light emitting device 31 is provided through a bump 33, and an underfill material 30 for an optical semiconductor device is formed between the light emitting device 31 and a housing material 35. Each end of two lead electrodes 34 extending along the side face from the top face to the bottom face of a housing material 35 is arranged between the bump 33 and the housing material 35 and is electrically connected to the light emitting device 31. The light emitting device 31 and the underfill material 30 for an optical semiconductor device are sealed with the sealing agent 32 for an optical semiconductor device of the present invention. In the optical semiconductor device of the present invention shown in FIG. 3, the underfill material 30 for an optical semiconductor device is formed by charging the underfill material 30 into a space below the light emitting device 31 from a side gap after connecting the light emitting device 31 to the lead electrodes 34 with bumps 33.

Examples of applications of the optical semiconductor device of the present invention include, specifically, a light emitting diode, a semiconductor laser, and a photocoupler. The optical semiconductor device of the present invention can be suitably used in, for example, backlights of liquid crystal displays, lighting instruments, various sensors, printers, light sources of copying machines, light sources of automobile measuring instruments, signal lights, indicating lights, display devices, light sources of planar light-emitting devices, displays, decorative lighting devices, various lights, and switching devices.

Effects of the Invention

The present invention provides a highly transparent, heat-resistant and light-resistant sealing agent for an optical semiconductor device that provides excellent adhesion, and is capable of stably maintaining its shape and preventing sedimentation of a phosphor when used to seal a light emitting device of an optical semiconductor device. The present invention also provides an optical semiconductor device formed by using the sealing agent for an optical semiconductor device.

BEST MODE FOR CARRYING OUT THE INVENTION

Hereinafter, the present invention will be described in more detail by way of examples, but the present invention is not limited to these examples.

Synthesis Example 1

To a 2000-mL separable flask with a thermometer and a dropping device, dimethyldimethoxysilane (750 g) and 3-glycidoxy propyl(methyl)dimethoxysilane (150 g) were added, and the mixture was stirred at 50° C. To the mixture, potassium hydrate (1.9 g)/water (250 g) was slowly added dropwise. After adding the entire solution, the resulting mixture was stirred at 50° C. for 6 hours. To the resulting mixture, acetic acid (2.1 g) was added. The volatile components in the mixture were removed under reduced pressure, and then potassium acetate was removed by filtration to yield a polymer. The obtained polymer was washed with hexane/water, and the volatile components were removed under reduced pressure to yield polymer A. Polymer A has a molecular weight Mn of 11,000 and a molecular weight Mw of 25,000, and the formula of polymer A was $(Me_2SiO_{2/2})_{0.90}(GEpMeSiO_{2/2})_{0.10}$ from $^{29}$Si-NMR analysis. The 3-glycidoxypropyl-group content (GEp) was 14 mol %, and the epoxy equivalent was 760 g/eq.

Polymer A (10 mg) was added with tetrahydrofuran (1 mL), and the resulting mixture was stirred until the polymer was dissolved. The obtained polymer solution was measured by a GPC method using a measuring apparatus (column: Shodex GPC LF-804 (300 mm in length×2) produced by Showa Denko K.K., measuring temperature: 40° C., flow rate: 1 mL/min, solvent: tetrahydrofuran, standard sample: polystyrene) produced by Waters Corporation to determine the molecular weight. The epoxy equivalent was determined according to JIS K-7236.

Synthesis Example 2

To a 2000-mL separable flask with a thermometer and a dropping device, dimethyldimethoxysilane (440 g) and 2-(3,4-epoxycyclohexyl)ethyltrimethoxysilane (160 g) were added, and the mixture was stirred at 50° C. To the mixture, potassium hydrate (1.2 g)/water (170 g) was slowly added dropwise. After adding the entire solution, the resulting mixture was stirred at 50° C. for 6 hours. To the resulting mixture, acetic acid (1.3 g) was added. The volatile components in the mixture were removed under reduced pressure, and then potassium acetate was removed by filtration to yield a polymer. The obtained polymer was washed with hexane/water, and the volatile components were removed under reduced pressure to yield polymer. B. Polymer B had a molecular weight Mn of 2,300 and a molecular weight Mw of 4,800, and the formula of polymer B was $(Me_2SiO_{2/2})_{0.84}(EpSiO_{3/2})_{0.16}$ from $^{29}$Si-NMR analysis. The 2-(3,4-epoxycyclohexyl)ethyl-group content (Ep) was 22 mol %, and the epoxy equivalent was 550 g/eq.

The molecular weight and the epoxy equivalent of polymer B were determined in the same manner as in Synthetic Example 1.

Synthesis Example 3

In a 2000-mL separable flask with a thermometer and a dropping device, dimethyldimethoxysilane (350 g), trimethoxymethylsilane (125 g), and 2-(3,4-epoxycyclohexyl)ethyltrimethoxysilane (125 g) were stirred at 50° C. To the mixture, potassium hydrate (1.2 g)/water (190 g) was slowly added dropwise. After adding the entire solution, the resulting mixture was stirred at 50° C. for 6 hours. To the resulting mixture, acetic acid (1.3 g) was added. The volatile components in the mixture were removed under reduced pressure, and then potassium acetate was removed by filtration to yield a polymer. The obtained polymer was washed with hexane/water, and the volatile components were removed under reduced pressure to yield polymer C. Polymer C had a molecular weight Mn of 2,900 and a molecular weight Mw of 4,600, and the formula of polymer C was $(Me_2SiO_{2/2})_{0.65}(MeSiO_{3/2})_{0.22}(EpSiO_{3/2})_{0.13}$ from $^{29}$Si-NMR analysis. The 2-(3,4-epoxycyclohexyl)ethyl-group content (Ep) was 19 mol %, and the epoxy equivalent was 660 g/eq.

The molecular weight and the epoxy equivalent of polymer C were determined in the same manner as in Synthetic Example 1.

Synthesis Example 4

To a 2000-mL separable flask with a thermometer and a dropping device, dimethyldimethoxysilane (230 g), cyclohexyl(methyl)dimethoxysilane (110 g), and 2-(3,4-epoxycyclohexyl)ethyltrimethoxysilane (110 g) were added, and the mixture was stirred at 50° C. To the mixture, potassium hydrate (0.6 g)/water (114 g) was slowly added dropwise. After adding the entire solution, the resulting mixture was stirred at 50° C. for 6 hours. To the resulting mixture, acetic acid (0.7 g) was added. The volatile components in the mixture were removed under reduced pressure, and then potassium acetate was removed by filtration to yield a polymer. The obtained polymer was washed with hexane/water, and the volatile components were removed under reduced pressure to yield polymer D. Polymer D had a molecular weight Mn of 2,000 and a molecular weight Mw of 4,600, and the formula of polymer D was $(Me_2SiO_{2/2})_{0.65}(MeCHSiO_{2/2})_{0.20}(EpSiO_{3/2})_{0.15}$ from $^{29}$Si-NMR analysis (CH represents a cyclohexyl group). The 2-(3,4-epoxycyclohexyl)ethyl-group content (Ep) was 19 mol %, and the epoxy equivalent was 690 g/eq.

The molecular weight and the epoxy equivalent of polymer D were determined in the same manner as in Synthetic Example 1.

Synthesis Example 5

To a 2000-mL separable flask with a thermometer and a dropping device, dimethyldimethoxysilane (400 g), trimethoxymethylsilane (50 g), tetramethoxysilane (50 g), and 3-glycidoxypropyltrimethoxysilane (100 g) were added, and the mixture was stirred at 50° C. To the mixture, potassium hydrate (1.3 g)/water (180 g) was slowly added dropwise. After adding the entire solution, the resulting mixture was stirred at 50° C. for 6 hours. To the resulting mixture, acetic acid (1.4 g) was added. The volatile components in the mixture were removed under reduced pressure, and then potassium acetate was removed by filtration to yield a polymer. The obtained polymer was washed with hexane/water, and the volatile components were removed under reduced pressure to yield polymer E. Polymer E had a molecular weight Mn of 2,600 and a molecular weight Mw of 3,600, and the formula of polymer E was $(Me_2SiO_{2/2})_{0.73}(MeSiO_{3/2})_{0.09}(GEpSiO_{3/2})_{0.10}(SiO_{4/2})_{0.08}$ from $^{29}$Si-NMR analysis. The 3-glycidoxypropyl-group content (GEp) was 14 mol %, and the epoxy equivalent was 760 g/eq.

The molecular weight and the epoxy equivalent of polymer E were determined in the same manner as in Synthetic Example 1.

Synthesis Example 6

To a 2000-mL separable flask with a thermometer and a dropping device, dimethyldimethoxysilane (365 g), 2-(3,4-epoxycyclohexyl)ethyltrimethoxysilane (165 g), and trimethylmethoxysilane (70 g) were added, and the mixture was stirred at 50° C. To the mixture, potassium hydrate (1.2 g)/water (160 g) was slowly added dropwise. After adding the entire solution, the resulting mixture was stirred at 50° C. for 6 hours. To the resulting mixture, acetic acid (1.3 g) was added. The volatile components in the mixture were removed under reduced pressure; and then potassium acetate was removed by filtration to yield a polymer. The obtained polymer was washed with hexane/water, and the volatile components were removed under reduced pressure to yield polymer F. Polymer F had a molecular weight Mn of 2,000 and a molecular weight Mw of 3,500, and the formula of polymer F was $(Me_3SiO_{1/2})_{0.12}(Me_2SiO_{2/2})_{0.71}(EpSiO_{3/2})_{0.17}$ from $^{29}$Si-NMR analysis. The 2-(3,4-epoxycyclohexyl)ethyl-group content (Ep) was 23 mol %, and the epoxy equivalent amount was 560 g/eq.

The molecular weight and the epoxy equivalent of polymer F were determined in the same manner as in Synthetic Example 1.

Example 1

Polymer A (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, Ltd., 0.1 g), AEROSIL R8200 (fine particulate material of silicon oxide [treated with trimethylsilyl group; specific surface area: 140 m$^2$/g], produced by Nihon Aerosil Co., Ltd., 30 g) were mixed and defoamed to yield a sealing agent.

Example 2

Polymer B (100 g), RIKACID MH-700G (acid anhydride, produced by New Japan Chemical Co., Ltd., 25 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 3

Polymer B (100 g), RIKACID MH-700G (acid anhydride, produced by New Japan Chemical Co., Ltd., 25 g), U-CAT SA 102 (curing accelerator, produced by SAN-APRO Ltd., 0.5 g), Sandostab P-EPQ (antioxidant, produced by Clariant, LTD., 0.1 g), AEROSIL 200 (fine particulate material of silicon oxide [without surface treatment; specific surface area: 200 m$^2$/g], produced by Nihon Aerosil Co., Ltd., 20 g) were mixed and defoamed to yield a sealing agent.

Example 4

Polymer B (100 g), RIKACID MH-700G (acid anhydride, produced by New Japan Chemical Co., Ltd., 25 g), U-CAT SA 102 (curing accelerator, produced by SAN-APRO Ltd., 0.5 g), Sandostab P-EPQ (antioxidant, produced by Clariant, LTD., 0.1 g), AEROSIL RY200 (fine particulate material of silicon oxide [treated with polydimethylsiloxane; specific surface area: 120 m$^2$/g], produced by Nihon Aerosil Co., Ltd., 10 g) were mixed and defoamed to yield a sealing agent.

Example 5

Polymer B (100 g), RIKACID MH-700G (acid anhydride, produced by New Japan Chemical Co., Ltd., 25 g), a tetraphenyl borate salt of 1,5-diazabicyclo[4,3,0]nonene-5 (DBN-K, curing accelerator, produced by Hokko Chemicals Co., Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 6

Polymer B (100 g), RIKACID MH-700G (acid anhydride, produced by New Japan Chemical Co., Ltd., 25 g), tetra-n- butylammonium n-butyltriphenyl borate (P3B, curing accelerator, produced by Showa Denko K.K., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 7

Polymer A (20 g), polymer B (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 8

Polymer A (40 g), polymer B (60 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 25 g) were mixed and defoamed to yield a sealing agent.

Example 9

Polymer A (20 g), polymer B (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL RY200 (fine particulate material of silicon oxide [treated with polydimethylsiloxane group; specific surface area: 120 m$^2$/g], produced by Nihon Aerosil Co., Ltd., 7 g) were mixed and defoamed to yield a sealing agent.

Example 10

Polymer A (20 g), polymer C (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 11

Polymer A (20 g), polymer D (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 20 g) were mixed and defoamed to yield a sealing agent.

Example 12

Polymer E (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 15 g) were mixed and defoamed to yield a sealing agent.

Example 13

Polymer A (20 g), polymer E (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 15 g) were mixed and defoamed to yield a sealing agent.

Example 14

Polymer F (100 g), RIKACID MH-700G (acid anhydride, produced by New Japan Chemical Co., Ltd., 25 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 25 g) were mixed and defoamed to yield a sealing agent.

Example 15

Polymer A (20 g), polymer F (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 25 g) were mixed and defoamed to yield a sealing agent.

Comparative Example 1

Polymer A (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g) were mixed and defoamed to yield a sealing agent.

Comparative Example 2

Polymer A (20 g), polymer B (80 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g) were mixed and defoamed to yield a sealing agent.

Comparative Example 3

Polymer A (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 10 g) were mixed and defoamed to yield a sealing agent.

Comparative Example 4

Polymer E (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL RX200 (fine particulate material of silicon oxide [treated with trimethylsilyl group; specific surface area: 140 m$^2$/g], produced by Nihon Aerosil Co., Ltd., 25 g) were mixed and defoamed to yield a sealing agent.

Comparative Example 5

Polymer B (100 g), RIKACID MH-700G (acid anhydride, produced by New Japan Chemical Co., Ltd., 25 g), U-CAT SA 102 (curing accelerator, produced by SAN-APRO Ltd., 0.5 g), Sandostab P-EPQ (antioxidant, produced by Clariant, LTD., 0.1 g), AEROSIL RY200 (fine particulate material of silicon oxide [treated with polydimethylsiloxane; specific surface area: 120 m$^2$/g], produced by Nihon Aerosil Co., Ltd., 10 g), AEROSIL R8200 (fine particulate material of silicon oxide [treated with trimethylsilyl group; specific surface area: 140 m$^2$/g], produced by Nihon Aerosil Co., Ltd., 10 g) were mixed and defoamed to yield a sealing agent.

Comparative Example 6

Polymer E (100 g), RIKACID MH-700G (acid anhydride, produced by New Japan Chemical Co., Ltd., 20 g), U-CAT SA 102 (curing accelerator, produced by SAN-APRO Ltd., 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 3 g) were mixed and defoamed to yield a sealing agent.

Comparative Example 7

Polymer B (100 g), RIKACID MH-700G (acid anhydride, produced by New Japan Chemical Co., Ltd., 25 g), tricyclohexylphosphine (curing accelerator, 0.5 g), Sandostab P-EPQ (antioxidant, produced by Clariant, LTD., 0.1 g), AEROSIL R8200 (fine particulate material of silicon oxide [treated with trimethylsilyl group; specific surface area: 140 m$^2$/g], produced by Nihon Aerosil Co., Ltd., 10 g) were mixed and defoamed to yield a sealing agent.

(Evaluation)

The sealing agents prepared in Examples and Comparative Examples and their cured products were evaluated as follows. Each of the sealing agents prepared in Examples and Comparative Examples was charged into a mold and cured at 100° C. for 3 hours and then at 130° C. for 3 hours. Thus, cured products having a thickness of 1 mm were obtained. Tables 1 to 3 show the results.

(1) Measurement of Viscosity at 25° C.

The sealing agents prepared in Examples and Comparative Examples were measured for the viscosity (mPa·s) at 5 rpm at 25° C. using an E-type viscometer (TV-22, produced by Toki Sangyo Co., Ltd.).

(2) Measurement of Thixotropic Value at 25° C.

The sealing agents prepared in Examples and Comparative Examples were measured for the viscosity (mPa·s) at 1 rpm at 25° C. and the viscosity at 10 rpm at 25° C. using an E-type viscometer (TV-22, produced by Toki Sangyo Co., Ltd.). The thixotropic value was calculated by dividing the value of the viscosity at 1 rpm by the value of the viscosity at 10 rpm (viscosity at 1 rpm/viscosity at 10 rpm).

(3) Measurement of Minimum Viscosity with Increase in Temperature

The sealing agents prepared in Examples and Comparative Examples were measured for the minimum viscosity (mPa·s) at 1 s$^{-1}$ in the temperature range of 25° C. to the curing temperature of the sealing agent using a parallel plate rheometer (DAR-2000, produced by Rheologica Instruments AB). The measurement was performed at a temperature rising rate of 20° C./min from 25° C. to the curing temperature, and continued until a rapid increase of the viscosity at the curing temperature was confirmed.

(4) Sedimentation Tendency of Phosphor

An amount of 4 parts by weight of YAG/Ce phosphor powder [$Y_3Al_5O_{12}$:Ce, average particle size: 2.5 μm, maximum particle size: 35 μm, specific gravity 4.7] was added to each of 100 parts by weight of the sealing agents prepared in Examples and Comparative Examples, and the mixtures were stirred and defoamed. Each phosphor-containing sealing agent was placed in a transparent glass vessel, and was cured at 100° C. for 3 hours and then at 130° C. for 3 hours. Following the curing, the phosphor in the cured product was visually observed. The evaluation was based on the following criteria.

"◯◯": no sedimentation of the phosphor was observed.
"◯": slight sedimentation of the phosphor was observed.
"Δ": sedimentation of the phosphor was observed.
"X": significant sedimentation of the phosphor was observed.

(5) Discharge Amount of Sealing Agent

An optical semiconductor device was prepared in which a light emitting device having a main luminous peak of 460 nm was mounted on a housing material (PPA) with lead electrodes through a die bond material, and a light emitting device is electrically connected to the lead electrodes via a gold wire. To the optical semiconductor device, each of the sealing agents prepared in Examples and Comparative Examples was applied with a dispenser in such a manner that the housing material is completely filled with the sealing agent. The discharge amount was microscopically observed. For each sealing agent, 20 samples were observed. The evaluation was based on the following criteria.

"◯◯": no variations in the discharge amount were found.
"◯": slight variations in the discharge amount were found.
"Δ": variations in the discharge amount were found.
"X": significant variations in the discharge amount were found.

(6) Shape of Sealing Agent

An optical semiconductor device was prepared in which a light emitting device having a main luminous peak of 460 nm was mounted on a housing material (PPA) having lead electrodes through a die bond material, and a light emitting device is electrically connected to the lead electrodes via a gold wire. To the optical semiconductor device, each of the sealing agents prepared in Examples and Comparative Examples was applied with a dispenser in such a manner that the housing material is completely filled with the sealing agent. The shape was microscopically observed. The evaluation was based on the following criteria.

"○": almost no variations in the shape were found.
"Δ": slight variations in the shape were found.
"X": large variations in the shape were found.

(7) Color Non-Uniformity

An optical semiconductor device was prepared in which a light emitting device having a main luminous peak of 460 nm was mounted on a housing material (PPA) having lead electrodes through a die bond material, and a light emitting device is electrically connected to the lead electrodes via a gold wire. To the optical semiconductor device, each of the sealing agents prepared in Examples and Comparative Examples was applied with a dispenser in such a manner that the housing material is completely filled with the sealing agent. Optical semiconductor device samples with no variations in the filled amount were selected, and cured at 100° C. for 3 hours and then at 130° C. for 3 hours. In total, ten of the light emitting devices were simultaneously made to emit light at 20 mA, the obtained optical semiconductors (package) were visually observed through a milky-white substrate. The evaluation of the color uniformity among the optical semiconductor devices was based on the following criteria.

"○○": Uniform.
"○": Slightly non-uniform.
"Δ": Non-uniform.
"X": Significantly non-uniform.

(8) Initial Light Transmittance

The light transmittance at 400 nm was measured with "U-4000" produced by Hitachi, Ltd. using the cured products having a thickness of 1 mm.

(9) Light Transmittance after Light Resistance Test

The cured product having a thickness of 0.1 mm was irradiated at 100 mW/cm$^2$ for 24 hours with a high-pressure mercury vapor lamp to which a filter for cutting light having a wavelength of 340 nm or less was attached, and measured using "U-4000" produced by Hitachi, Ltd. for the light transmittance at 400 nm. The decrease ratio of the light transmittance from the initial value was evaluated based on the following criteria.

"○○": less than 5%.
"○": less than 10%.
"Δ": 10% or higher but less than 40%.
"X": 40% or higher.

(10) Light Transmittance after Heat Resistance Test

The cured product having a thickness of 1 mm was left in an oven at 150° C. for 500 hours and 2,000 hours, and measured for the light transmittance at 400 nm using "U-4000" produced by Hitachi. The decrease ratio of the light transmittance from the initial value was evaluated based on the following criteria.

"○○": less than 5%.
"○": less than 10%.
"Δ": 10% or higher but less than 40%.
"X": 40% or higher.

TABLE 1

|  |  | Example | | | | | | | |
|---|---|---|---|---|---|---|---|---|---|
|  |  | 1 | 2 | 3 | 4 | 5 | 6 | 7 | 8 |
| Evaluation | Viscosity at 25° C. (mPa · s) | 1500 | 3000 | 2000 | 4000 | 3000 | 3000 | 1500 | 800 |
|  | Thixotropic value at 25° C. | 2.2 | 1.8 | 1.4 | 2.3 | 1.8 | 1.8 | 1.7 | 1.9 |
|  | Minimum viscosity with increase in temperature | 180 | 360 | 130 | 370 | 300 | 300 | 220 | 120 |
|  | Precipitation tendency of phosphor | ○ | ○○ | ○ | ○○ | ○○ | ○○ | ○○ | ○ |
|  | Discharge amount of sealing agent | ○○ | ○○ | ○○ | ○○ | ○○ | ○○ | ○○ | ○○ |
|  | Shape of sealing agent | ○ | ○ | ○ | ○ | ○ | ○ | ○ | ○ |
|  | Color non-uniformity | ○ | ○○ | ○ | ○○ | ○○ | ○○ | ○○ | ○ |

|  |  | Example | | | | | | |
|---|---|---|---|---|---|---|---|---|
|  |  | 9 | 10 | 11 | 12 | 13 | 14 | 15 |
| Evaluation | Viscosity at 25° C. (mPa · s) | 1200 | 2500 | 2500 | 8500 | 5000 | 3500 | 2500 |
|  | Thixotropic value at 25° C. | 2.1 | 1.7 | 1.8 | 1.7 | 1.7 | 1.9 | 1.9 |
|  | Minimum viscosity with increase in temperature | 200 | 300 | 130 | 500 | 350 | 380 | 280 |
|  | Precipitation tendency of phosphor | ○○ | ○○ | ○ | ○○ | ○○ | ○○ | ○○ |
|  | Discharge amount of sealing agent | ○○ | ○○ | ○○ | ○ | ○○ | ○○ | ○○ |
|  | Shape of sealing agent | ○ | ○ | ○ | ○ | ○ | ○ | ○ |
|  | Color non-uniformity | ○○ | ○○ | ○ | ○○ | ○○ | ○○ | ○○ |

TABLE 2

|  |  | Comparative Example | | | | | | |
|---|---|---|---|---|---|---|---|---|
|  |  | 1 | 2 | 3 | 4 | 5 | 6 | 7 |
| Evaluation | Viscosity at 25° C. (mPa · s) | 200 | 600 | 400 | 15000 | 7000 | 2000 | 1000 |
|  | Thixotropic value at 25° C. | 1.05 | 1.05 | 1.3 | 2.2 | 2.8 | 1.1 | 1.3 |
|  | Minimum viscosity with increase in temperature | 40 | 80 | 90 | 700 | 350 | 180 | 80 |
|  | Precipitation tendency of phosphor | X | X | Δ | ○○ | ○○ | Δ | X |
|  | Discharge amount of sealing agent | ○○ | ○○ | ○○ | X | Δ | ○○ | ○○ |
|  | Shape of sealing agent | ○ | ○ | ○ | X | X | ○ | ○ |
|  | Color non-uniformity | X | X | Δ | ○○ | ○○ | Δ | X |

TABLE 3

|  | | Example | | |
|---|---|---|---|---|
|  | | 2 | 5 | 6 |
| Evaluation | Initial transmittance (%) | 90 | 90 | 90 |
|  | Light resistance test | ◯◯ | ◯◯ | ◯◯ |
|  | Heat resistance test (500 hrs) | ◯◯ | ◯◯ | ◯◯ |
|  | Heat resistance test (2000 hrs) | ◯ | ◯◯ | ◯◯ |

INDUSTRIAL APPLICABILITY

The present invention provides a highly transparent, heat-resistant and light-resistant sealing agent for an optical semiconductor device that provides excellent adhesion, and is capable of stably maintaining its shape and preventing sedimentation of a phosphor when used to seal a light emitting device of an optical semiconductor device. The present invention also provides an optical semiconductor device formed by using the sealing agent for optical semiconductor devices.

BRIEF DESCRIPTION OF THE DRAWINGS

FIG. 1 is a cross-sectional view schematically showing one example of an optical semiconductor device obtained by using a sealing agent for an optical semiconductor device of the present invention and a die bond material for an optical semiconductor device;

FIG. 2 is a cross-sectional view schematically showing one example of an optical semiconductor device obtained by using a sealing agent for an optical semiconductor device of the present invention and a die bond material for an optical semiconductor device; and FIG. 3 is a cross-sectional view schematically showing an example of an optical semiconductor device obtained by using a sealing agent for an optical semiconductor device of the present invention and an underfill material for an optical semiconductor device.

EXPLANATION OF SYMBOLS 10, 20 Die bond material for optical semiconductor device
11, 21, 31 Light emitting device
12, 22, 32 Sealing agent for optical semiconductor
13, 23 Gold wire
14, 24, 34 Lead electrode
15, 25, 35 Housing material
16 Heat sink
30 Underfill material for optical semiconductor
33 Bump

The invention claimed is:

1. A sealing agent for an optical semiconductor device, which comprises: a silicone resin having a cyclic ether-containing group in the molecular structure; a heat curing agent capable of reacting with said cyclic ether-containing group; and a fine particulate material of silicon oxide, and the sealing agent having a viscosity of 500 to 10,000 mPa·s measured by an E-type viscometer at 25° C. at 5 rpm, a thixotropic value of 1.2 to 2.5 calculated by dividing a viscosity measured by the E-type viscometer at 25° C. at 1 rpm by a viscosity measured at 10 rpm (viscosity at 1 rpm/viscosity at 10 rpm), and a minimum viscosity of 100 mPa·s or higher measured at 1 s$^{-1}$ in the temperature range of 25° C. to a curing temperature by a parallel plate rheometer.

2. The sealing agent for an optical semiconductor device according to claim 1, wherein the silicone resin having a cyclic ether-containing group in the molecular structure contains the cyclic ether-containing group in an amount of 0.1 to 50 mol %, and a resin component represented by average chemical composition formula (1):

$$(R^1R^2R^3SiO_{1/2})_a(R^4R^5SiO_{2/2})_b(R^6SiO_{3/2})_c(SiO_{4/2})_d \quad (1)$$

wherein at least one of $R^1$ to $R^6$ represents the cyclic ether-containing group, each of groups other than the group representing the cyclic ether-containing group among $R^1$ to $R^6$ represents a linear or branched $C_{1-8}$ hydrocarbon or a fluorinated compound thereof, and these may be the same as or different from one another; and a, b, c and d satisfy the following formulas:

$$0 \leq a/(a+b+c+d) \leq 0.2;$$

$$0.3 \leq b/(a+b+c+d) \leq 1.0;$$

$$0 \leq c/(a+b+c+d) \leq 0.5; \text{ and}$$

$$0 \leq d/(a+b+c+d) \leq 0.3.$$

3. The sealing agent for an optical semiconductor device according to claim 1, wherein the heat curing agent comprises an acid anhydride compound.

4. The sealing agent for an optical semiconductor device according to claim 1, wherein the fine particulate material of silicon oxide is surface treated with an organic silicon compound having a trimethylsilyl group or an organic silicon compound having a polydimethyl siloxane group.

5. The sealing agent for an optical semiconductor device according to claim 1, wherein the fine particulate material of silicon oxide has a BET specific surface area of 30 to 400 m²/g.

6. The sealing agent for an optical semiconductor device according to claim 1, which further comprises a phosphor.

7. The sealing agent for an optical semiconductor device according to claim 1, which further comprises a curing accelerator having a structure represented by formula (14):

$$X^+[BR^{44}R^{45}R^{46}R^{47}]^- \quad (14)$$

wherein $R^{44}$ to $R^{47}$ each represent a fluoro group, a substituted or unsubstituted alkyl group, a substituted or unsubstituted alkenyl group, a substituted or unsubstituted aralkyl group, a substituted or unsubstituted aryl group, or a substituted or unsubstituted alicyclic group, and these may be the same as or different from one another; and $X^+$ represents a cation having N, S or P as a central atom.

8. The sealing agent for an optical semiconductor device according to claim 7, wherein $X^+$ in formula (14) representing the structure of the curing accelerator has a structure represented by formula (15):

$$Y^+(R^{48})_n \quad (15)$$

wherein $Y^+$ represents N, S, or P; n is 3 or 4; and a plurality of $R^{48}$s each represent a substituted or unsubstituted alkyl group, a substituted or unsubstituted alkenyl group, a substituted or unsubstituted aralkyl group, a substituted or unsubstituted aryl group, a substituted or unsubstituted heterocyclic group, a substituted or unsubstituted alicyclic group, or a substituted or unsubstituted silyl group, and these are the same as or different from one another.

9. The sealing agent for an optical semiconductor device according to claim 7, wherein three of $R^{44}$ to $R^{47}$ in formula (14) representing the structure of the curing accelerator represent a substituted or unsubstituted aryl group, and the other one represents a substituted or unsubstituted alkyl group.

10. An optical semiconductor device having the sealing agent for an optical semiconductor device according to claim 1.

* * * * *